US010984830B2

(12) United States Patent
Ozyilmaz et al.

(10) Patent No.: US 10,984,830 B2
(45) Date of Patent: Apr. 20, 2021

(54) TWO DIMENSIONAL AMORPHOUS CARBON AS OVERCOAT FOR HEAT ASSISTED MAGNETIC RECORDING MEDIA

(71) Applicant: National University of Singapore, Singapore (SL)

(72) Inventors: Barbaros Ozyilmaz, Singapore (SG); Chee-Tat Toh, Singapore (SG); Hongji Zhang, Singapore (SG); Alexander Mayorov, Singapore (SG); Darim Badur Ferry, Singapore (SG); Henrik Andersen, Singapore (SG); Cagdas Cetin, Singapore (SG); Irfan Haider Abidi, Singapore (SG)

(73) Assignee: The National University of Singapore, Singapore (SG)

( * ) Notice: Subject to any disclaimer, the term of this patent is extended or adjusted under 35 U.S.C. 154(b) by 107 days.

(21) Appl. No.: 16/181,656

(22) Filed: Nov. 6, 2018

(65) Prior Publication Data

US 2019/0080713 A1 Mar. 14, 2019

Related U.S. Application Data

(63) Continuation-in-part of application No. 16/049,034, filed on Jul. 30, 2018, which is a continuation-in-part of application No. 15/901,099, filed on Feb. 21, 2018.

(60) Provisional application No. 62/463,112, filed on Feb. 24, 2017, provisional application No. 62/546,680, filed on Aug. 17, 2017, provisional application No.
(Continued)

(51) Int. Cl.
*G11B 5/72* (2006.01)
*G11B 5/84* (2006.01)
*G11B 5/712* (2006.01)
*C23C 16/26* (2006.01)
(Continued)

(52) U.S. Cl.
CPC .............. *G11B 5/712* (2013.01); *C23C 16/26* (2013.01); *C23C 16/483* (2013.01); *G11B 5/72* (2013.01); *G11B 5/727* (2020.08); *G11B 5/7266* (2020.08); *G11B 5/7366* (2019.05); *G11B 5/8408* (2013.01)

(58) Field of Classification Search
None
See application file for complete search history.

(56) References Cited

U.S. PATENT DOCUMENTS 4,725,345 A * 2/1988 Sakamoto ........... C23C 14/0605
 204/192.11
5,266,409 A * 11/1993 Schmidt .............. C23C 14/0605
 360/112
(Continued)

FOREIGN PATENT DOCUMENTS

DE 102009034573 A1 2/2010
JP 09091686 A 9/1995
(Continued)

OTHER PUBLICATIONS

Derwent Abstract Translation of JP 09-091686 A (Year: 1997).*
(Continued)

*Primary Examiner* — Kevin M Bernatz
(74) *Attorney, Agent, or Firm* — Ajay A. Jagtiani; Miles & Stockbridge P.C.

(57) ABSTRACT

A recording device comprising an overcoat layer, wherein the overcoat layer comprises an amorphous carbon overcoat layer having a crystallinity (C)≤0.8.

22 Claims, 19 Drawing Sheets

Related U.S. Application Data

62/736,768, filed on Sep. 26, 2018, provisional application No. 62/755,693, filed on Nov. 5, 2018.

(51) Int. Cl.
*C23C 16/48* (2006.01)
*G11B 5/73* (2006.01)

(56) References Cited

U.S. PATENT DOCUMENTS

| | | | | |
|---|---|---|---|---|
| 5,989,672 | A | * | 11/1999 | Hayashi ............ G11B 5/72 428/141 |
| 8,173,282 | B1 | | 5/2012 | Sun et al. |
| 8,760,980 | B2 | | 6/2014 | Zhang et al. |
| 8,877,340 | B2 | * | 11/2014 | Chu ............ B82Y 30/00 428/408 |
| 8,941,950 | B2 | | 1/2015 | Yuan et al. |
| 9,640,213 | B2 | * | 5/2017 | Hasegawa ............ G11B 5/72 |
| 9,792,935 | B2 | | 10/2017 | Rejda et al. |
| 2002/0051903 | A1 | | 5/2002 | Masuko et al. |
| 2010/0319078 | A1 | * | 12/2010 | McKnight ............ C12N 5/0018 800/14 |
| 2011/0048943 | A1 | | 3/2011 | Nemes |
| 2011/0129675 | A1 | * | 6/2011 | Choi ............ H01L 31/036 428/408 |
| 2011/0151278 | A1 | * | 6/2011 | Gurney ............ G11B 5/3106 428/800 |
| 2011/0290655 | A1 | | 12/2011 | Nishikiori et al. |
| 2013/0214875 | A1 | * | 8/2013 | Duncan ............ B82Y 40/00 333/186 |
| 2014/0248513 | A1 | * | 9/2014 | Takizawa ............ G11B 5/746 428/835 |
| 2015/0093684 | A1 | | 4/2015 | Yadav et al. |
| 2016/0036801 | A1 | | 2/2016 | Moghaddam et al. |
| 2016/0111180 | A1 | | 4/2016 | Joo et al. |
| 2017/0032815 | A1 | * | 2/2017 | Oezyilmaz ............ C23C 16/26 |
| 2017/0186457 | A1 | * | 6/2017 | Ng ............ G11B 5/255 |
| 2017/0263966 | A1 | | 9/2017 | Lozada et al. |
| 2018/0244524 | A1 | * | 8/2018 | Ozyilmaz ............ A61L 27/50 |
| 2019/0088420 | A1 | * | 3/2019 | Tour ............ C01B 32/184 |
| 2020/0346934 | A1 | * | 11/2020 | Thomas ............ C01B 32/194 |

FOREIGN PATENT DOCUMENTS

| | | | | |
|---|---|---|---|---|
| JP | 09091686 | A | * | 4/1997 |
| JP | 2002143185 | A | | 5/2002 |
| JP | 2002312923 | A | * | 10/2002 ............ B65D 1/0292 |
| JP | 02002312923 | A | | 10/2002 |
| WO | 03/065881 | A2 | | 8/2003 |

OTHER PUBLICATIONS

JPO Abstract Translation of JP-2002312923-A (Year: 2002).*
Office Action received in U.S. Appl. No. 15/901,099 dated Apr. 1, 2020.
Office Action received in U.S. Appl. No. 16/049,034 dated Mar. 31, 2020.
Kotakoski et al, "Toward Two-Dimensional All-Caron Heterostructures via Ion Beam Patterning of Single-Layer Graphene", Nano Letters, vol. 15, pp. 5944-5949 (2015).
Zhao et al., "Sythesis of large-scale undoped and nitrogen-doped amorphous graphene on MgO substrate by chemical vapor deposition", Journal of Materials Chemistry, vol. 22, pp. 19679-19683 (2012).
Zachariasen, "The Atomic Arrangement in Glass", J. Am. Chem. Soc., 54, pp. 3841-3851 (1932).
Treacy et al., "The Local Structure of Amorphous Silicon", Science, vol. 335, pp. 950-953 (2012).
Gibson et al., "Substantial Crystalline Topology in Amorphous Silicon", Physical Review Letters, 105, 125504 (2010).
Wright, "Neutron scattering from vitreous silica. V. The structure of vitreous silica: What have we learned from 60 years of diffraction studies?", J. Non-Cryst. Solids, 179, pp. 84-115 (1994).
Wright, "The Great Crystallite Versus Random Network Controversy: A Personal Perspective", Int. J. Appl. Glass Sci. 5, pp. 31-56 (2014).
Gibson, "Solving Amorphous Structures—Two Pairs Beat One", Science 335, pp. 929-930 (2012).
Eder et al., "A journey from order to disorder—Atom by atom transformation from graphene to a 2D carbon glass" Sci. Rep., 4, 4060 (2014).
Kotakoski et al., "From Point Defects in Graphene to Two-Dimensional Amorphous Carbon", Phys. Rev. Lett., 106, 105505 (2011).
Stachurski, "On Structure and Properties of Amorphous Materials", Materials 4, pp. 1564-1598 (2011).
Joo et al., "Realization of continuous Zachariasen carbon monolayer", Sci. Adv., 3, e1601821 (2017).
Araujo et al., "M. S. Defects and impurities in graphene-like materials", Materials Today, vol. 15, No. 3, pp. 98-109 (2012).
Lichtenstein et al., "The Atomic Structure of a Metal-Supported Vitreous Thin Silica Film", Angew. Chem. Int. Ed. 51, pp. 404-407 (2012).
Nicholl et al., "The effect of intrinsic crumpling on the mechanics of free-standing graphene", Nat. Commun. 6, 8789 (2015).
Lee et al., "Measurement of the Elastic Properties and Intrinsic Strength of Monolayer Graphene", Science, vol. 321, pp. 385-388 (2008).
Rodin et al., "Apparent Power-Law Behavior of Conductance in Disordered Quasi-One-Dimensional Systems", Phys. Rev. Lett. 105, 106801 (2010).
Tauc, "Optical properties and electronic structure of amorphous Ge and Si", Mater. Res. Bull., vol. 3, pp. 37-46 (1968).
Lee et al., "Stabilization of graphene nanopore", PNAS, vol. 111, No. 21, pp. 7522-7526 (2014).
Zhuang et al., "Evolution of domains and grain boundaries in graphene: a kinetic Monte Carlo simulation", Phys. Chem. Chem. Phys., 18, pp. 2932-2939 (2016).
Stuart et al., "A reactive potential for hydrocarbons with intermolecular interactions", J. Chem. Phys., vol. 112, No. 14, pp. 6472-6486 (2000).
Plimpton, "Fast Parallel Algorithms for Short-Range Molecular Dynamics", J. Comput. Phys. vol. 117, pp. 1-19 (1995).
Perdew et al, "Generalized Gradient Approximation Made Simple", Phys. Rev. Lett., vol. 77, No. 18, pp. 3865-3868 (1996).
Kresse et al., "Efficient iterative schemes for ab initio total-energy calculations using a plane-wave basis set", Phys. Rev. B, vol. 54, No. 16, pp. 11169-11186 (1996).
Koenig et al., "Selective molecular sieving through porous graphene", Nature Nanotechnology, vol. 7, pp. 728-732 (2012).
Koenig, "Ultrastrong adhesion of graphene membranes", Nature Nanotechnology, vol. 6, pp. 543-546 (2011).
Ferrari, A.C. et al. "Interpretation of Raman spectra of disordered and amorphous carbon." Physical Review B 61, 14095-14107 (2000).
Robertson, J. "Ultrathin carbon coatings for magnetic storage technology." Thin Solid Films 383, 81-88 (2001).
Hu, S. et al. "Proton transport through one-atom-thick crystals." Nature 516, 227-230 (2014).
Das, S. et al. "Measurements of adhesion energy of graphene to metallic substrates." Carbon 59, 121-129 (2013).
Schriver, M. et al. "Graphene as a Long-Term Metal Oxidation Barrier: Worse Than Nothing" ACS Nano 7, 5763-5768 (2013).
Wang, J. S. et al. "The mechanical performance of DLC films on steel substrates." Thin Solid Films 325, 163-174 (1998).
Leng, Y. X. et al. "Mechanical properties and platelet adhesion behavior of diamond-like carbon films synthesized by pulsed vacuum arc plasma deposition." Surface Science 531, 177-184 (2003).
Maguire, P. D. et al. "Mechanical stability, corrosion performance and bioresponse of amorphous diamond-like carbon for medical stents and guidewires." Diamond and Related Materials 14, 1277-1288 (2005).
Marcon, et. al. "The head-disk interface roadmap to an areal density of 4 Tbit/in2." Advances in Tribology 2013, 1-8 (2013).

(56) References Cited

OTHER PUBLICATIONS

Discher, D. E., Mooney, D. J. & Zandstra, P. W. "Growth Factors, Matrices, and Forces Combine and Control Stem Cells." Science 324, 1673-1677 (2009).
Spradling, A., Drummond-Barbosa, D. & Kai, T. "Stem cells find their niche." Nature 414, 98-104 (2001).
Murry, C. E. & Keller, G. "Differentiation of Embryonic Stem Cells to Clinically Relevant Populations: Lessons from Embryonic Development." Cell 132, 661-680 (2008).
Engler, A. J., Sen, S., Sweeney, H. L. & Discher, D. E. "Matrix Elasticity Directs Stem Cell Lineage Specification." Cell 126, 677-689 (2006).
Dalby, M. J. et al. "The control of human mesenchymal cell differentiation using nanoscale symmetry and disorder." Nature Materials 6, 997-1003 (2007).
Trappmann, B. et al. "Extracellular-matrix tethering regulates stem-cell fate." Nature Materials 11, 642-649 (2012).
Lee, H. et al. "Establishment of feeder-free culture system for human induced pluripotent stem cell on DAS nanocrystalline graphene." Scientific Reports 6, 20708 (2016).
Choi, W. J. et al. "Effects of substrate conductivity on cell morphogenesis and proliferation using tailored, atomic layer deposition-grown ZnO thin films." Scientific Reports 5, 9974 (2015).
Share, O. Z. & Orhan, M. F. "An overview of fuel cell technology: Fundamentals and applications." Renewable and Sustainable Energy Reviews 32, 810-853 (2014).
Schmittinger, W. & Vahidi, A. "A review of the main parameters influencing long-term performance and durability of PEM fuel cells." Journal of Power Sources 180, 1-14 (2008).
Reiser, C. A. "A reverse-current decay mechanism for fuel cells." J Electrochem Solid-State Letters 8, A273-A276 (2005).
Li, X. S. et al. Large-Area Synthesis of High-Quality and Uniform Graphene Films on Copper Foils Science 324, 1312-1314 (2009).
Lozada-Hidalgo et al., "Sieving hydrogen isotopes through two-dimensional crystals", Science, vol. 351, Issue 6268, pp. 68-70 (2016).
Dwivedi et al., "Understanding the Role of Nitrogen in Plasma-Assisted Surface Modification of Magnetic Recording Media with and without Ultrathin Carbon Overcoats", Scientific Reports, 5, 7772 (2015).
Rose et al., "Complete characterization by Raman spectroscopy of the structural properties of thin hydrogenated diamond-like carbon films exposed to rapid thermal annealing", Journal of Applied Physics, 116, 123516-1 to 123516-12 (2014).
Jones et al., "Understanding Disk Carbon Loss Kinetics for Heat Assisted Magnetic Recording", IEEE Transactions on Magnetics, vol. 50, No. 3, 3300704 (2014).
Herman, "Laser-Assisted Deposition of Thin Films from Gas-Phase and Surface-Adsorbed Molecules", Chem. Rev., 39, pp. 1323-1357 (1989).
Huang, "Direct Imaging of a Two-Dimensional Silica Glass on Graphene", Nano Letters, 12, 1081-1086 (2012).
Zhang, "Clean Transfer of Large Graphene Single Crystals for High-Intactness Suspended Membranes and Liquid Cells", Advanced Matters, 29, 1700639 (1-7), (2017).
Zandiatashbar, "Effect of defects on the intrinsic strength and stiffness of graphene", Nature Communications, 5, 3186 (2014).
Gomez-Navarro, "Atomic Structure of Reduced Graphene Oxide", Nano Letters, 10, 1144-1148 (2010).
Lichtenstein et al., "Crystalline-Vitreous Interface in Two Dimensional Silica", Physical Review Letters, 109, 106101 (2012).
Jain et al., "Rupture of amorphous graphene via void formation", Phys. Chem. Chem. Phys., 20, 16966 (2018).
Zhang, "Thermal conductivity of graphene nanoribbons under shear deformation: A molecular dynamics simulation", Scientific Reports, vol. 7, 41398 (2017).
Ruiz-Vargas, "Softened Elastic Response and Unzipping in Chemical Vapor Deposition Graphene Membranes", Nano Letters, 11, 2259-2263 (2011).
Zhang et al., "Fracture toughness of graphene", Nature Communications, 5:3782 (2014).
Gui et al., "Band structure engineering of graphene by strain: First-principles calculations", Physical Review B, 78, 075435 (2008).
Ritter et al., "The influence of edge structure on the electronic properties of graphene quantum dots and nanoribbons", Nature Materials, vol. 8, pp. 235-242 (2009).
Mahvash et al., "Space-Charge Limited Transport in Large-Area Monolayer Hexagonal Boron Nitride", Nano Letters, 15, pp. 2263-2268 (2015).
Rose, "Space-Charge-Limited Currents in Solids", Physical Review, vol. 97, No. 6, 1538-1544 (1955).
Kim, "Defect-Mediated In-Plane Electrical Conduction in Few-Layer sp2-Hybridized Boron Nitrides", ACS Appl. Mater. Interfaces, 10, pp. 17287-17294 (2018).
Rodin et al., "Hopping transport in systems of finite thickness or length", Physical Review B, 84, 125447 (2011).
Chae et al., "Mass Transport through a Proton Exchange Membrane (Nafion) in Microbial Fuel Cells", Energy & Fuels, 22, pp. 169-176 (2008).
Office Action received in U.S. Appl. No. 15/901,099 dated Aug. 19, 2020.
Office Action received in U.S. Appl. No. 16/049,034 dated Aug. 21, 2020.
Office Action received in U.S. Appl. No. 16/181,656 dated Aug. 19, 2020.
Office Action received in U.S. Appl. No. 16/181,656 dated Dec. 3, 2020.
Extended European Search Report received in European Application No. 18757600.4 dated Nov. 19, 2020.
International Preliminary Report on Patentability received in International Application No. PCT/SG2018/050082 dated Aug. 27, 2019.
International Search Report received in International Application No. PCT/SG2018/050082 dated May 14, 2018.
Casiraghi et al., "Dynamic Roughening of Tetrahedral Amorphous Carbon", Physical Review Letters, vol. 91, No. 22, pp. 226104-1-226104-4 (2003).
D'Angelo et al., "Micropatterned Hydrogenated Amorphous Carbon Guides Mesenchymal Stem Cells Towards Neuronal Differentiation", European Cells and Materials, vol. 20, pp. 231-244 (2010).
Mattioli et al., "Nanostructured Polystyrene Films Engineered by Plasma Processes: Surface Characterization and Stem Cell Interaction", Journal of Applied Polymer Science, pp. 40427 (1-10) (2014).
Joo et al., "Realization of continuous Zachariasen carbon monolayer", Science Advances, vol. 3, pp. 1-8 (2017).
Kotakoski et al., "From Point Defects in Graphene to Two-Dimensional Amorphous Carbon", Physical Review Letters, vol. 106, No. 10, pp. 105505-1-105505-4 (2011).
Suk et al., Mechanical measurements of ultra-thin amorphous carbon membranes using scanning atomic force microscopy, Carbon, vol. 50, No. 6, pp. 2220-2225 (2012).
Office Action received in Japanese Application No. 2019-546155 dated Nov. 17, 2020.
Wang et al. "Controllable synthesis of 2D Amorphous Carbon and Partially Graphitic Carbon Materials: Large Improvement of Electrochemical Performance by the Redox Additive of sulfanilic Acid Azochromotrop in KOH Electrolyte"; Electrochimica Acta; vol. 200, pp. 247-258; (2016).
Kotakoski et al.; "From Point Defects in Graphene to Two Dimensional Amorphous Carbon"; Physical Review Letters, PRL 106, 105505 (2011).
Office Action received in U.S. Appl. No. 15/901,099 dated Jan. 13, 2021.

\* cited by examiner

US 10,984,830 B2

TWO DIMENSIONAL AMORPHOUS CARBON AS OVERCOAT FOR HEAT ASSISTED MAGNETIC RECORDING MEDIA

CROSS-REFERENCE TO RELATED APPLICATIONS

This application claims benefit of priority of U.S. patent application Ser. No. 16/049,034 filed Jul. 30, 2018 entitled "Proton Conductive Two-Dimensional Amorphous Carbon Film for Gas Membrane and Fuel Cell Applications", which claims priority to U.S. patent application Ser. No. 15/901,099 entitled, "Two-Dimensional Amorphous Carbon Coating and Methods of Growing and Differentiating Stem Cells," filed Feb. 21, 2018, PCT International Application No. PCT/SG2018/050082 filed Feb. 23, 2018, which claim priority to U.S. Provisional Patent Application No. 62/546,680 entitled, "Therapeutic Coating and Methods of Growing and Differentiating Stem Cells," filed Aug. 17, 2017 and U.S. Provisional Application No. 62/463,112 entitled, "Layered Composite Material Consisting Atomically Thin Amorphous Carbon on Top of the Substrate," filed Feb. 24, 2017. This application also claims benefit of priority of U.S. Provisional Application No. 62/736,768 filed Sep. 26, 2018 entitled "Synthesis and Properties of Atomically Thin, Single Layer, Free Standing Amorphous Carbon." This application also claims benefit of priority of U.S. Provisional Application No. 62/755,693 filed Nov. 5, 2018 entitled "Synthesis and Properties of Free-Standing Monolayer Amorphous Carbon." The entire contents and disclosures of these patent applications are incorporated herein by reference in their entirety.

BACKGROUND

Field of the Invention

The present disclosure relates to generally to two-dimensional amorphous carbon (2DAC) coating techniques. More particularly, the present disclosure is directed to an overcoat for magnetic recording media which provides good anti-corrosion property and high thermal stability. Disclosed embodiments are aimed to increase the areal density of storage media by improving the performance of heat assisted magnetic recording media (HAMR).

BACKGROUND OF THE INVENTION

A need exists within the prior art to develop improved magnetic recording media and provide enhanced performance of the same.

SUMMARY

According to first broad aspect, the present disclosure provides a recording device comprising an overcoat layer, wherein the overcoat layer comprises an amorphous carbon overcoat layer having a crystallinity (C)≤0.8.

According to a second broad aspect, the present disclosure provides a magnetic recording media device comprising a substrate layer; an adhesion layer; a heat sink layer; a soft under layer; another under layer; a recording layer; a capping layer; an overcoat layer, and a lubricant layer, wherein the overcoat layer comprises an amorphous carbon overcoat layer having a crystallinity (C)≤0.8.

According to third broad aspect, the present disclosure provides a method of manufacturing a recording device comprising applying an overcoat layer to a substrate, wherein the overcoat layer comprises an amorphous carbon overcoat layer having a crystallinity (C)≤0.8.

According to a fourth broad aspect, the present disclosure provides a method of manufacturing a magnetic recording media device comprising a substrate layer; an adhesion layer; a heat sink layer; a soft under layer; another under layer; a recording layer; a capping layer; an overcoat layer, and a lubricant layer, and applying the overcoat layer to the substrate, wherein the overcoat layer comprises an amorphous carbon overcoat layer having a crystallinity (C)≤0.8.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

Definitions

Figure 1:
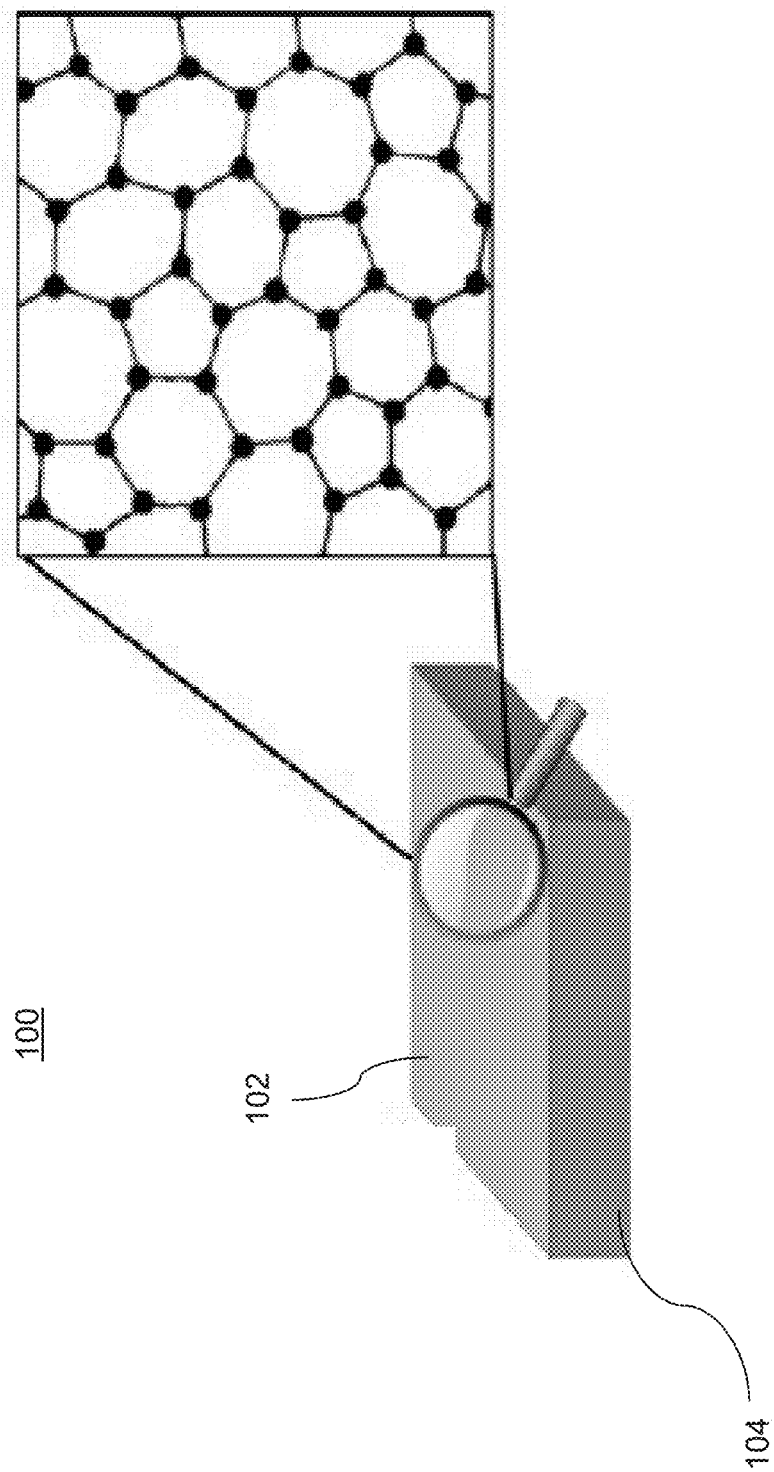
FIG. 1 is a schematic illustration showing the disclosed composite material of the atomically thin film showing random hexagon rings showing continuity and order (not graphene), according to one embodiment of the present disclosure.

Where the definition of terms departs from the commonly used meaning of the term, applicant intends to utilize the definitions provided below, unless specifically indicated.

It is to be understood that the foregoing general description and the following detailed description are exemplary and explanatory only and are not restrictive of any subject matter claimed. In this application, the use of the singular includes the plural unless specifically stated otherwise. It must be noted that, as used in the specification and the appended claims, the singular forms "a," "an" and "the" include plural referents unless the context clearly dictates otherwise. In this application, the use of "or" means "and/or" unless stated otherwise. Furthermore, use of the term "including" as well as other forms, such as "include", "includes," and "included," is not limiting.

For purposes of the present disclosure, the term "comprising", the term "having", the term "including," and variations of these words are intended to be open-ended and mean that there may be additional elements other than the listed elements.

For purposes of the present disclosure, directional terms such as "top," "bottom," "upper," "lower," "above," "below," "left," "right," "horizontal," "vertical," "up," "down," etc., are used merely for convenience in describing the various embodiments of the present disclosure. The embodiments of the present disclosure may be oriented in various ways. For example, the diagrams, apparatuses, etc., shown in the drawing Figures may be flipped over, rotated by 90° in any direction, reversed, etc.

For purposes of the present disclosure, a value or property is "based" on a particular value, property, the satisfaction of a condition, or other factor, if that value is derived by performing a mathematical calculation or logical decision using that value, property or other factor.

For purposes of the present disclosure, it should be noted that to provide a more concise description, some of the quantitative expressions given herein are not qualified with the term "about." It is understood that whether the term "about" is used explicitly or not, every quantity given herein is meant to refer to the actual given value, and it is also meant to refer to the approximation to such given value that would reasonably be inferred based on the ordinary skill in the art, including approximations due to the experimental and/or measurement conditions for such given value.

For purposes of the present disclosure, the term "adhesion strength" refers to the strength of the bonding between the disclosed 2DAC film to its growth substrate. It is directly dependent on the adhesion energy between these two materials, which may be measured in $J/m^2$.

For purposes of the present disclosure, the term "amorphous carbon" refers to carbon that does not have any long range crystalline structure.

For purposes of the present disclosure, the term "amorphous" refers to lacking definite form or having no specific shape or being formless. As a non-crystalline solid, amorphous refers to a solid that lacks the long-range order that is characteristic of a crystal.

For purposes of the present disclosure, the term "atomically thin amorphous carbon" refers to amorphous carbon that consist of approximately one to five layers of carbon atoms in a plane, with predominantly $sp^2$ bonding between the carbon atoms and thus forming a layer. It should be appreciated that layers may be stacked, and this stacking of layers is considered within the scope of the invention.

For purposes of the present disclosure, the term "carbon coating" refers to a layer of carbon deposited on a substrate.

For purposes of the present disclosure, the term "carbon ring size" refers to the size of a ring of carbon atoms. In some disclosed embodiments, the number of atoms in one carbon ring may vary from 4 to 9 atoms.

For purposes of the present invention, the term "contact angle measurement" refers to a technique to measure the hydrophobicity of a surface. In an exemplary disclosed embodiment of a water droplet, this angle may be measured from the surface to the water-air interface. A small angle means that the surface favorably attracts water and a large angle suggests that the surface repels water.

For purposes of the present disclosure, the term "computer hardware" and the term "hardware" refer to the digital circuitry and physical devices of a computer system, as opposed to computer software, which is stored on a hardware device such as a hard disk. Most computer hardware is not seen by normal users, because it is embedded within a variety of every day systems, such as in automobiles, microwave ovens, electrocardiograph machines, compact disc players, and video games, among many others. A typical personal computer consists of a case or chassis in a tower shape (desktop) and the following parts: motherboard, CPU, RAM, firmware, internal buses (PIC, PCI-E, USB, Hyper-Transport, CSI, AGP, VLB), external bus controllers (parallel port, serial port, USB, Firewire, SCSI. PS/2, ISA, EISA, MCA), power supply, case control with cooling fan, storage controllers (CD-ROM, DVD, DVD-ROM, DVD Writer, DVD RAM Drive, Blu-ray, BD-ROM, BD Writer, floppy disk, USB Flash, tape drives, SATA, SAS), video controller, sound card, network controllers (modem, NIC), and peripherals, including mice, keyboards, pointing devices, gaming devices, scanner, webcam, audio devices, printers, monitors, etc.

For purposes of the present disclosure, the term "computer network" refers to a group of interconnected computers. Networks may be classified according to a wide variety of characteristics. The most common types of computer networks in order of scale include: Personal Area Network (PAN), Local Area Network (LAN), Campus Area Network (CAN), Metropolitan Area Network (MAN), Wide Area Network (WAN), Global Area Network (GAN), Internetwork (intranet, extranet, Internet), and various types of wireless networks. All networks are made up of basic hardware building blocks to interconnect network nodes, such as Network Interface Cards (NICs), Bridges, Hubs, Switches, and Routers. In addition, some method of connecting these building blocks is required, usually in the form of galvanic cable (most commonly category 5 cable). Less common are microwave links (as in IEEE 802.11) or optical cable ("optical fiber").

For purposes of the present disclosure, the term "computer software" and the term "software" refers to one or more computer programs, procedures and documentation that perform some tasks on a computer system. The term includes application software such as word processors which perform productive tasks for users, system software such as operating systems, which interface with hardware to provide the necessary services for application software, and middleware which controls and co-ordinates distributed systems. Software may include websites, programs, video games, etc. that are coded by programming languages like C, C++, Java, etc. Computer software is usually regarded as anything but hardware, meaning the "hard" are the parts that are tangible (able to hold) while the "soft" part is the intangible objects inside the computer. Computer software is so called to distinguish it from computer hardware, which encompasses the physical interconnections and devices required to store and execute (or run) the software. At the lowest level, software consists of a machine language specific to an individual processor. A machine language consists of groups of binary values signifying processor instructions which change the state of the computer from its preceding state.

For purposes of the present disclosure, the term "computer system" refers to any type of computer system that implements software including an individual computer such as a personal computer, mainframe computer, mini-computer, etc. In addition, computer system refers to any type of network of computers, such as a network of computers in a business, the Internet, personal data assistant (PDA), devices such as a cell phone, a television, a videogame console, a compressed audio or video player such as an MP3 player, a DVD player, a microwave oven, etc. A personal computer is one type of computer system that typically includes the following components: a case or chassis in a tower shape (desktop) and the following parts: motherboard, CPU, RAM, firmware, internal buses (PIC, PCI-E, USB, Hyper-Transport, CSI, AGP, VLB), external bus controllers (parallel port, serial port, USB, Firewire, SCSI. PS/2, ISA, EISA, MCA), power supply, case control with cooling fan, storage controllers (CD-ROM, DVD, DVD-ROM, DVD Writer, DVD RAM Drive, Blu-ray, BD-ROM, BD Writer, floppy disk, USB Flash, tape drives, SATA, SAS), video controller, sound card, network controllers (modem, NIC), and peripherals, including mice, keyboards, pointing devices, gaming devices, scanner, webcam, audio devices, printers, monitors, etc.

For purposes of the present disclosure, the term "computer" refers to any type of computer or other device that implements software including an individual computer such as a personal computer, laptop computer, tablet computer, mainframe computer, mini-computer, etc. A computer also refers to electronic devices such as an electronic scientific instrument such as a spectrometer, a smartphone, an eBook reader, a cell phone, a television, a handheld electronic game console, a videogame console, a compressed audio or video player such as an MP3 player, a Blu-ray player, a DVD player, etc. In addition, the term "computer" refers to any type of network of computers, such as a network of computers in a business, a computer bank, the Cloud, the Internet, etc. Various processes of the present disclosure may be carried out using a computer. Various functions of the present disclosure may be performed by one or more computers.

For purposes of the present disclosure, the term "DIG ratio" refers to the ratio of the intensities of the D and G peak in the Raman spectrum.

For purposes of the present disclosure, the term "data storage medium" or "data storage device" refers to any medium or media on which a data may be stored for use by a computer system. Examples of data storage media include floppy disks, Zip™ disks, CD-ROM, CD-R, CD-RW, DVD, DVD-R, memory sticks, flash memory, hard disks, solid state disks, optical disks, etc. Two or more data storage media acting similarly to a single data storage medium may be referred to as a "data storage medium" for the purposes of the present disclosure. A data storage medium may be part of a computer.

For purposes of the present disclosure, the term "data" means the reinterpretable representation of information in a formalized manner suitable for communication, interpretation, or processing. Although one type of common type data is a computer file, data may also be streaming data, a web service, etc. The term "data" is used to refer to one or more pieces of data.

For purposes of the present disclosure, the term "database" or "data record" refers to a structured collection of records or data that is stored in a computer system. The structure is achieved by organizing the data according to a database model. The model in most common use today is the relational model. Other models such as the hierarchical model and the network model use a more explicit representation of relationships (see below for explanation of the various database models). A computer database relies upon software to organize the storage of data. This software is known as a database management system (DBMS). Database management systems are categorized according to the database model that they support. The model tends to determine the query languages that are available to access the database. A great deal of the internal engineering of a DBMS, however, is independent of the data model, and is concerned with managing factors such as performance, concurrency, integrity, and recovery from hardware failures. In these areas there are large differences between products.

For purposes of the present disclosure, the term "diamond-like carbon" refers to amorphous carbon that consist of predominantly $sp^3$ bonding between carbon atoms.

For purposes of the present disclosure, the term "differentiating stem cells" refers to the process of directing an unspecialized stem cell towards a specific type of cell with functional traits. In disclosed embodiments, the differentiation occurs due to a combination of chemical and substrate induced factors.

For purposes of the present disclosure, the term "electrochemical cell (EC)" refers to a device capable of either generating electrical energy from chemical reactions or facilitating it otherwise. The electrochemical cells which generate an electric current are called voltaic cells or galvanic cells and the other ones are called electrolytic cells which are used to drive chemical reactions like electrolysis. A common example of galvanic cells is a standard 1.5-volt cell meant for consumer use. A battery may consist of one or more cells, connected in either parallel or series pattern.

For purposes of the present disclosure, the term "fuel cell" refers to an electrochemical cell that converts the chemical energy from a fuel into electricity through an electrochemical reaction of hydrogen fuel with oxygen or another oxidizing agent. Fuel cells may differ from batteries in requiring a continuous source of fuel and oxygen (usually from air) to sustain the chemical reaction, whereas in a battery the chemical energy comes from chemicals already present in the battery. Fuel cells can produce electricity continuously for as long as fuel and oxygen are supplied.

For purposes of the present disclosure, the term "graphene" refers to an allotrope (form) of carbon consisting of a single layer of carbon atoms arranged in a hexagonal lattice. It is the basic structural element of many other allotropes of carbon, such as graphite, charcoal, carbon nanotubes and fullerenes. It can be considered as an indefinitely large aromatic molecule, the ultimate case of the family of flat polycyclic aromatic hydrocarbons. Graphene has many unusual properties including its strong materials properties, ability to efficiently conduct heat and electricity and is also nearly transparent.

For purposes of the present disclosure, the term "hardware and/or software" refers to functions that may be performed by digital software, digital hardware, or a combination of both digital hardware and digital software. Various features of the present disclosure may be performed by hardware and/or software.

For purposes of the present disclosure, the term "hydrophobic" refers to tending to repel or fail to mix with water.

For purposes of the present disclosure, the term "hydrophobicity" refers to the property of repelling water rather than absorbing it or dissolving in it.

For purposes of the present disclosure, the term "individual" refers to an individual mammal, such as a human being.

For purposes of the present disclosure, the term "Internet" is a global system of interconnected computer networks that interchange data by packet switching using the standardized Internet Protocol Suite (TCP/IP). It is a "network of networks" that consists of millions of private and public, academic, business, and government networks of local to global scope that are linked by copper wires, fiber-optic cables, wireless connections, and other technologies. The Internet carries various information resources and services, such as electronic mail, online chat, file transfer and file sharing, online gaming, and the inter-linked hypertext documents and other resources of the World Wide Web (WWW).

For purposes of the present disclosure, the term "intranet" refers to a set of networks, using the Internet Protocol and IP-based tools such as web browsers and file transfer applications that are under the control of a single administrative entity. That administrative entity closes the intranet to all but specific, authorized users. Most commonly, an intranet is the internal network of an organization. A large intranet will typically have at least one web server to provide users with organizational information. Intranets may or may not have connections to the Internet. If connected to the Internet, the intranet is normally protected from being accessed from the Internet without proper authorization. The Internet is not considered to be a part of the intranet.

For purposes of the present disclosure, the term "laser-assisted chemical vapor deposition (CVD)" refers to a synthesis method where a laser-heated substrate is exposed to one or more volatile precursors, which react or decompose on the surface to produce a deposit.

For purposes of the present disclosure, the term "local area network (LAN)" refers to a network covering a small geographic area, like a home, office, or building. Current LANs are most likely to be based on Ethernet technology. The cables to the servers are typically on Cat 5e enhanced cable, which will support IEEE 802.3 at 1 Gbit/s. A wireless LAN may exist using a different IEEE protocol, 802.11b, 802.11g or possibly 802.11n. The defining characteristics of LANs, in contrast to WANs (wide area networks), include their higher data transfer rates, smaller geographic range, and lack of a need for leased telecommunication lines. Current Ethernet or other IEEE 802.3 LAN technologies operate at speeds up to 10 Gbit/s.

For purposes of the present disclosure, the term "machine-readable medium" refers to any tangible or non-transitory medium that is capable of storing, encoding or carrying instructions for execution by the machine and that cause the machine to perform any one or more of the methodologies of the present disclosure, or that is capable of storing, encoding or carrying data structures utilized by or associated with such instructions. The term "machine-readable medium" includes, but is limited to, solid-state memories, and optical and magnetic media. Specific examples of machine-readable media include non-volatile memory, including by way of example, semiconductor memory devices, e.g., EPROM, EEPROM, and flash memory devices; magnetic disks such as internal hard disks and removable disks; magneto-optical disks; and CD-ROM and DVD-ROM disks. The term "machine-readable medium" may include a single medium or multiple media (e.g., a centralized or distributed database, and/or associated caches and servers) that store the one or more instructions or data structures.

For purposes of the present disclosure, the term "membrane" refers to layer acting as a selective barrier that may allow some elements to pass through but stopping others such as molecules, ions, or other small particles.

For purposes of the present disclosure, the term "non-transient storage medium" refers to a storage medium that is non-transitory, tangible and computer readable. Non-transient storage medium may refer generally to any durable medium known in the art upon which data can be stored and later retrieved by data processing circuitry operably coupled with the medium. A non-limiting non-exclusive list of exemplary non-transitory data storage media may include magnetic data storage media (e.g., hard disc, data tape, etc.), solid state semiconductor data storage media (e.g., SDRAM, flash memory, ROM, etc.), and optical data storage media (e.g., compact optical disc, DVD, etc.).

For purposes of the present disclosure, the term "processor" refers to a device that performs the basic operations in a computer. A microprocessor is one example of a processor For purposes of the present disclosure, the term "Raman spectroscopy" refers to a spectroscopic technique used to observe vibrational, rotational, and other low-frequency modes in a system. Raman spectroscopy is commonly used in chemistry to provide a structural fingerprint by which molecules can be identified. It relies on inelastic scattering, or Raman scattering, of monochromatic light, usually from a laser in the visible, near infrared, or near ultraviolet range. The laser light interacts with molecular vibrations, phonons or other excitations in the system, resulting in the energy of the laser photons being shifted up or down. The shift in energy gives information about the vibrational modes in the system.

For purposes of the present disclosure, the term "Raman spectrum" refers to a phenomenon of scattering intensity as a function of frequency shifts depending on rovibronic states of a molecule. For a molecule to exhibit a Raman effect, there must be a change in its electric dipole-electric dipole polarizability with respect to the vibrational coordinate corresponding to the rovibronic state. The intensity of the Raman scattering is proportional to this polarizability change.

For purposes of the present disclosure, the term "random-access memory (RAM)" refers to a type of computer data storage. Today it takes the form of integrated circuits that allow the stored data to be accessed in any order, i.e. at random. The word random thus refers to the fact that any piece of data can be returned in a constant time, regardless of its physical location and whether or not it is related to the previous piece of data. This contrasts with storage mechanisms such as tapes, magnetic discs and optical discs, which rely on the physical movement of the recording medium or a reading head. In these devices, the movement takes longer than the data transfer, and the retrieval time varies depending on the physical location of the next item. The word RAM is mostly associated with volatile types of memory (such as DRAM memory modules), where the information is lost after the power is switched off. However, many other types of memory are RAM as well, including most types of ROM and a kind of flash memory called NOR-Flash.

For purposes of the present disclosure, the term "ratio of $sp^3/sp^2$" refers to the type of carbon bonds found in the 2DAC. The $sp^2$ bonds allow for higher growth factor bonding.

For purposes of the present disclosure, the term "read-only memory (ROM)" refers to a class of storage media used in computers and other electronic devices. Because data stored in ROM cannot be modified (at least not very quickly or easily), it is mainly used to distribute firmware (software that is very closely tied to specific hardware, and unlikely to require frequent updates). In its strictest sense, ROM refers only to mask ROM (the oldest type of solid state ROM), which is fabricated with the desired data permanently stored in it, and thus can never be modified. However, more modern types such as EPROM and flash EEPROM can be erased and re-programmed multiple times; they are still described as "read-only memory" because the reprogramming process is generally infrequent, comparatively slow, and often does not permit random access writes to individual memory locations.

For purposes of the present disclosure, the term "server" refers to a system (software and suitable computer hardware) that responds to requests across a computer network to provide, or help to provide, a network service. Servers can be run on a dedicated computer, which is also often referred to as "the server," but many networked computers are capable of hosting servers. In many cases, a computer can provide several services and have several servers running. Servers may operate within a client-server architecture and may comprise computer programs running to serve the requests of other programs—the clients. Thus, the server may perform some task on behalf of clients. The clients typically connect to the server through the network but may run on the same computer. In the context of Internet Protocol (IP) networking, a server is a program that operates as a socket listener. Servers often provide essential services across a network, either to private users inside a large organization or to public users via the Internet. Typical computing servers are database server, file server, mail server, print server, web server, gaming server, application server, or some other kind of server. Numerous systems use this client/server networking model including Web sites and email services. An alternative model, peer-to-peer networking may enable all computers to act as either a server or client as needed.

For purposes of the present disclosure, the term "solid-state electronics" refers to those circuits or devices built entirely from solid materials and in which the electrons, or other charge carriers, are confined entirely within the solid material. The term is often used to contrast with the earlier technologies of vacuum and gas-discharge tube devices and it is also conventional to exclude electro-mechanical devices (relays, switches, hard drives and other devices with moving parts) from the term solid state. While solid-state can include crystalline, polycrystalline and amorphous solids and refer to electrical conductors, insulators and semiconductors, the building material is most often a crystalline semiconductor. Common solid-state devices include transistors, microprocessor chips, and RAM. A specialized type of RAM called flash RAM is used in flash drives and more recently, solid state drives to replace mechanically rotating magnetic disc hard drives. More recently, the integrated circuit (IC), the light-emitting diode (LED), and the liquid-crystal display (LCD) have evolved as further examples of solid-state devices. In a solid-state component, the current is confined to solid elements and compounds engineered specifically to switch and amplify it.

For purposes of the present disclosure, the term "storage medium" refers to any form of storage that may be used to store bits of information. Examples of storage media include both volatile and non-volatile memories such as MRRAM, MRRAM, ERAM, flash memory, RFID tags, floppy disks, Zip™ disks, CD-ROM, CD-R, CD-RW, DVD, DVD-R, flash memory, hard disks, optical disks, etc. Two or more storage media acting similarly to a single data storage medium may be referred to as a "storage medium" for the purposes of the present disclosure. A storage medium may be part of a computer.

For purposes of the present disclosure, the term "substrate" refers to the structural support for the disclosed two-dimensional (2D) amorphous carbon film. In select applications, disclosed embodiments provide a substrate to mechanically support, for example, the 2DAC film as, otherwise, the 2DAC film may be too thin to perform its function without getting damaged. The substrate may be regarded as the material used for growth of the disclosed 2DAC or 2DAC film on the surface of the substrate.

For purposes of the present disclosure, the term "two-dimensional (2D) amorphous carbon film" refers to atomically thin amorphous carbon to the thinnest amorphous carbon possible (e.g., single atom thick) that can be grown directly, for example, on substrates including those having low melting temperature, are non-catalytic, and those substrates also including metal, glass and oxides surfaces. The growth on other substrates is made possible due to the low temperature at which the disclosed 2DAC film is grown. Disclosed embodiments of 2DAC film may be presented as a free-standing film or as a coating on a substrate as disclosed herein. Although the disclosed 2DAC film is amorphous, the carbon atoms bond to multiple adjacent carbon atoms in plane to form a strong network, which is very stable even when it is released from its growth substrate (free-standing). The carbon material also possesses properties for adhering to metal surfaces well, thereby ensuring full coverage across the substrate. The intrinsic thinness and the high strength of the disclosed 2DAC thin film also allow it to withstand bending of the metal substrate without breaking.

For purposes of the present disclosure, the term "two-dimensional (2D) amorphous carbon coating" refers to a 2DAC film directly grown and/or deposited on a substrate. Disclosed embodiments may also include the case where the 2DAC coating is transferred onto or off the substrate.

For purposes of the present disclosure, the term "water contact angle" refers.

For purposes of the present disclosure, the term "wide area network (WAN)" refers to a data communications network that covers a relatively broad geographic area (i.e. one city to another and one country to another country) and that often uses transmission facilities provided by common carriers, such as telephone companies. WAN technologies generally function at the lower three layers of the OSI reference model: the physical layer, the data link layer, and the network layer.

For purposes of the present disclosure, the term "World Wide Web Consortium (W3C)" refers to the main international standards organization for the World Wide Web (abbreviated WWW or W3). It is arranged as a consortium where member organizations maintain full-time staff for the purpose of working together in the development of standards for the World Wide Web. W3C also engages in education and outreach, develops software and serves as an open forum for discussion about the Web. W3C standards include: CSS, CGI, DOM, GRDDL, HTML, OWL, RDF, SVG, SISR, SOAP, SMIL, SRGS, SSML, VoiceXML, XHTML+ Voice, WSDL, XACML. XHTML, XML, XML Events, Xforms, XML Information, Set, XML Schema, Xpath, Xquery and XSLT.

Description

While the invention is susceptible to various modifications and alternative forms, specific embodiment thereof has been shown by way of example in the drawings and will be described in detail below. It should be understood, however that it is not intended to limit the invention to the particular forms disclosed, but on the contrary, the invention is to cover all modifications, equivalents, and alternatives falling within the spirit and the scope of the invention.

Magnetic media is widely used, for example, within data storage technology. Data storage technology may be utilized in a wide variety of applications including, for example, personal computers, cloud drive systems, internet implementations, etc. Areal density, is a key factor for hard disk capacity and refers to the amount of data that can be stored on a unit area of storage medium. In some applications, the data may be stored into the storage medium by switching the direction of magnetic bits in the storage medium. To increase the areal density, the size of individual magnetic bits may be reduced, which has a negative consequence of creating a weaker magnetic signal and lower signal-to-noise ratio. In order to overcome these signal challenges, the read head is required to be brought closer to the magnetic surface to improve the signal-to-noise ratio. The head to surface distance greatly depends on the thickness of the carbon overcoat. The overcoat used in the current art includes a thickness of about 2.7 nm.[1] In order to reach a storage density larger than 1 Tb/inch$^2$ for next generation hard disks, a carbon overcoat with a thickness of less than 1 nm is desired. In addition, it is also desirable to preserve anti-corrosion properties of the hard disk while protecting the same.

As the magnetic bits of the storage media become smaller, the magnetic bits need to possess a higher magnetization. In addition, the magnetic material should maintain a high coercivity in order to sustain a stable storage capacity. One example of employed materials includes a high magnetocrystalline anisotropy (Ku) $L1_0$ ordered FePt media.[2] The high coercivity of the aforementioned material allows it to maintain stable storage using very small magnetic bits. However, the operation of the storage media is impacted as it is, therefore, more difficult for the write head to flip the magnetic direction of the bit. By developing and providing an improved heat assisted magnetic recording device, it is possible to address and overcome the challenges in improving the areal storage density of recording media using such magnetic material. Conventional HAMR technology generally incudes an integrated laser in the read/write head to help heat up the magnetic bit up to its Curie temperature where the magnetic bits may be easily flipped. This facilitates easy writing of data. However, with a working environment under elevated temperature, it is a challenge for the magnetic device to have a thermally stable layer to provide good anti-corrosion protection. Thus, the carbon overcoat within the current prior art suffers from structural change and possible damage under the heating conditions of conventional HAMR technologies and processes. Embodiments of the present disclosure provide a new layer of overcoat to address the shortcomings of the prior art Hence, an amorphous carbon overcoat layer that can protect the underlying magnetic recording layer for heat assisted magnetic recording media (HAMR) is provided by disclosed embodiments, as described herein. The disclosed amorphous carbon overcoat layer can prevent corrosion of the media layer and reduce the friction between media and write head. In HAMR media, where the disclosed amorphous carbon overcoat may experience environments having elevated temperature levels, the disclosed amorphous carbon overcoat is stable under such thermal conditions and is able to improve the overall performance of the HAMR media.

Disclosed embodiments relate to a new composite material composed of an atomically thin (single layer) amorphous carbon on top of a substrate (metal, glass, oxides). The amorphous carbon adheres very well to the substrate upon which it is grown. Thus, the amorphous carbon material provides unique characteristics. For example, the disclosed amorphous carbon material is suitable for applications that utilize a substrate requiring a coating for a specific purpose(s). Exemplary applications may include, but not limited to, biomedical applications.

The present disclosure provides a new form of carbon referred to as two-dimensional (2D) amorphous carbon (2DAC). Disclosed embodiments provide the thinnest amorphous carbon possible (e.g., approximately single atom thick) within the 2DAC that can be grown, for instance, directly on metallic substrates including those having low melting temperature, are non-catalytic, and also including glass and oxides surfaces. In one select embodiment, having a single atom thickness is a preferred material and may establish a lower thickness limit for the 2DAC. Disclosed embodiments may include a thickness that may range up to a few atom thickness (e.g., 10 atomic thickness or about 3+nm). The disclosed 2DAC may be provided as a two-dimensional (2D) amorphous carbon film. It remains important to note, however, that as the thickness of the disclosed 2DAC increases, it remains structurally different (e.g., $sp^3$ to $sp^2$ ratio) from any other possibly existing amorphous carbon material thickness, as disclosed herein.

The growth on other substrates is made possible due to the low temperature at which the disclosed 2DAC film is grown. Although the disclosed 2DAC film is amorphous, the carbon atoms bond to multiple adjacent carbon atoms in plane to form a strong network, which is very stable even when it is released from its growth substrate (free-standing). Thus, each carbon atom is bonded to multiple carbon atoms such that there is a high density of bonds (connections). The disclosed 2DAC also possesses properties for adhering to metal surfaces well, thereby ensuring full coverage. Material properties (e.g., disclosed below), such as the intrinsic thinness and the high strength of the disclosed 2DAC thin film, also allow it to withstand bending of the metal substrate without breaking.

In accordance with disclosed embodiments, amorphous carbon may be defined as a form of carbon with no long-range structural order. It exists in several forms and, depending on its form, is often called in different names like diamond-like carbon, glassy carbon, soot, etc. Amorphous carbon may be produced by several techniques including, for example, chemical vapor deposition, sputter deposition, and cathodic arc deposition among others. In convention applications, amorphous carbon has always existed in three-dimensional form (or in bulk). The two-dimensional equivalent form of carbon is graphene; however, graphene only exists as a crystalline material (either single crystal or polycrystalline). For graphene to be synthesized, it requires high temperatures and is mostly grown on copper. As per this disclosure, disclosed embodiments have managed to create a continuous two-dimensional form of amorphous carbon that is grown at a much lower temperature and on arbitrary substrates. The composite material of the disclosed 2DAC film and substrate has characteristics that are vastly different from the bulk amorphous carbon, and even to single layer graphene.

Embodiments of the disclosed 2DAC may exist as a film, for example, coating a substrate, a film coating an internal surface of a porous structure, a suspended film, a rolled film, a tube, a fiber, or a hollow ball. The mechanical, electrical, optical, thermal and other properties of the disclosed 2DAC are expected to be varying, for example, depending on the shape of the 2DAC. For example a tube comprising the disclosed 2DAC will have high mechanical strength in the axial direction and softer response in the radial direction. One might prepare the disclosed 2DAC into various forms to utilize the different properties for separate applications.

FIG. 1 illustrates a schematic 100 of the disclosed composite materials with a TEM image of the carbon material on a top surface of a substrate. The composition of the disclosed matter is a new composite material of an atomically thin amorphous carbon 102 on top of a substrate 104 (e.g., metal or glass, oxides).

The disclosed composite material may refer to an atomically thin 2D amorphous carbon (2DAC) on top of an arbitrary substrate. In accordance with disclosed embodiments, the disclosed 2DAC film on top of the disclosed substrate may be defined in terms of its atomic structure and its properties.

Figure 2:
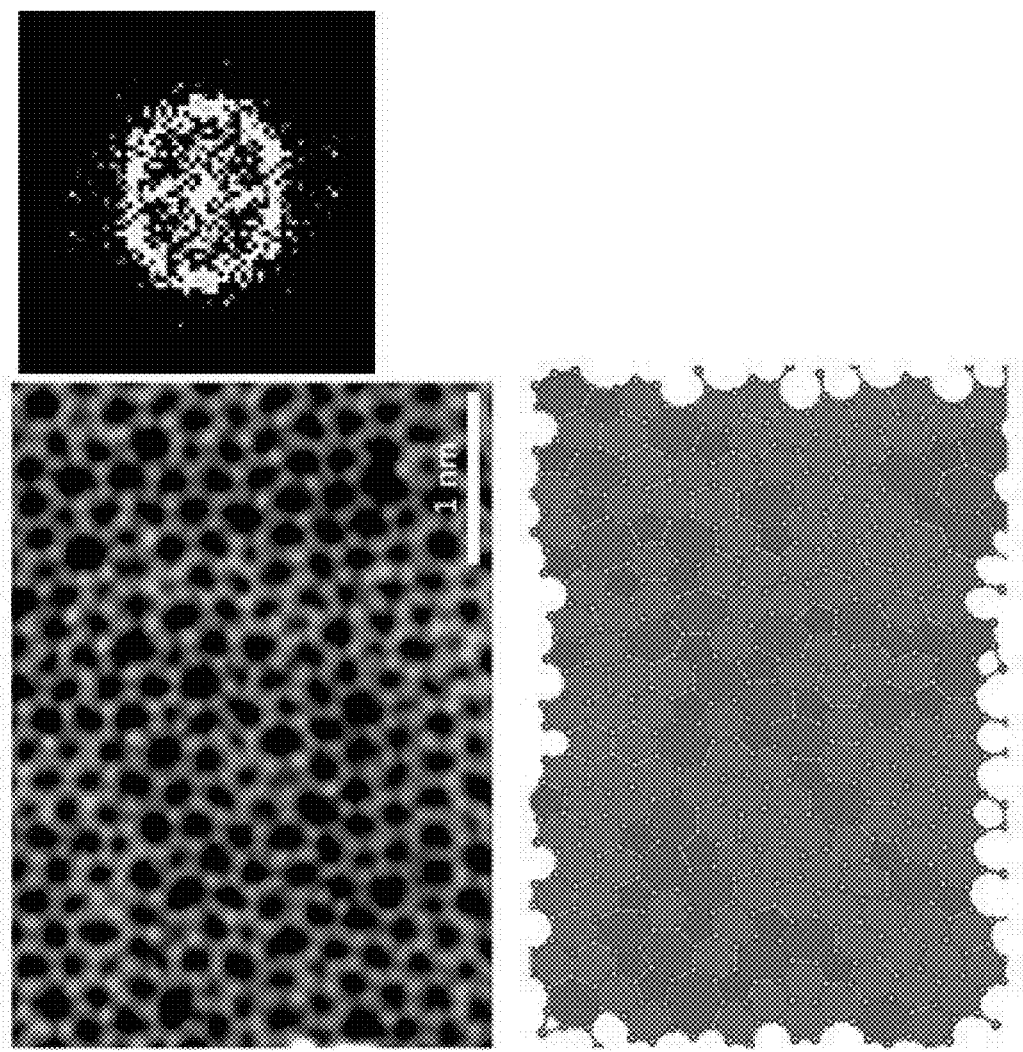
FIG. 2 illustrates a TEM image of an amorphous film showing the hexagons and non-hexagons, according to one embodiment of the present disclosure.

A closer examination and definition for the atomic structure may be presented as follows: FIG. 2 illustrates a TEM image of an amorphous film showing the hexagons and non-hexagons, according to one embodiment of the present disclosure. The upper left image of FIG. 2 illustrates a high resolution TEM image of the disclosed 2DAC film comprising hexagons and non-hexagons. A lower left schematic of the TEM image of the upper left image is provided to aid in viewing. Hexagons are colored in green, while non-hexagons are colored in either red or blue. The upper right display is an FFT illustrating which shows a ring structure with no clear diffraction patterns.

Referring to the TEM image of FIG. 2, a 2DAC film is a single-atom thick carbon film having a mixture of hexagon and non-hexagon rings in its structure. The rings are fully connected to each other, forming a network of polygons in large area film whose scale is at least in microns. The ratio of hexagons to non-hexagons is a measure of crystallinity (or amorphousity), C. Non-hexagons are in a form of 4-, 5-, 7-, 8-, 9-membered rings. A 2D amorphous film has C≤0.8, taken on a minimum imaged area of approximately 8.0 nm.$^3$ The C value in FIG. 2 is approximately 0.65. Disclosed embodiments may support a C value range between and including 0.5 to 0.8. This is different from graphene where C=1 for pure hexagonal network. The non-hexagons can be randomly distributed within the hexagonal matrix, or form along the boundaries of the hexagonal domains. The domains must not be greater than 5 nm. The fast Fourier transform (FFT) of the image must not show diffraction spots (FIG. 2, upper right). The 2DAC can be released from a substrate to be free-standing or can be transferred to other substrates. Thus, in some embodiments, the disclosed 2DAC may be separating from the surface of the substrate to obtain a free-standing 2DAC film.

Figure 3:
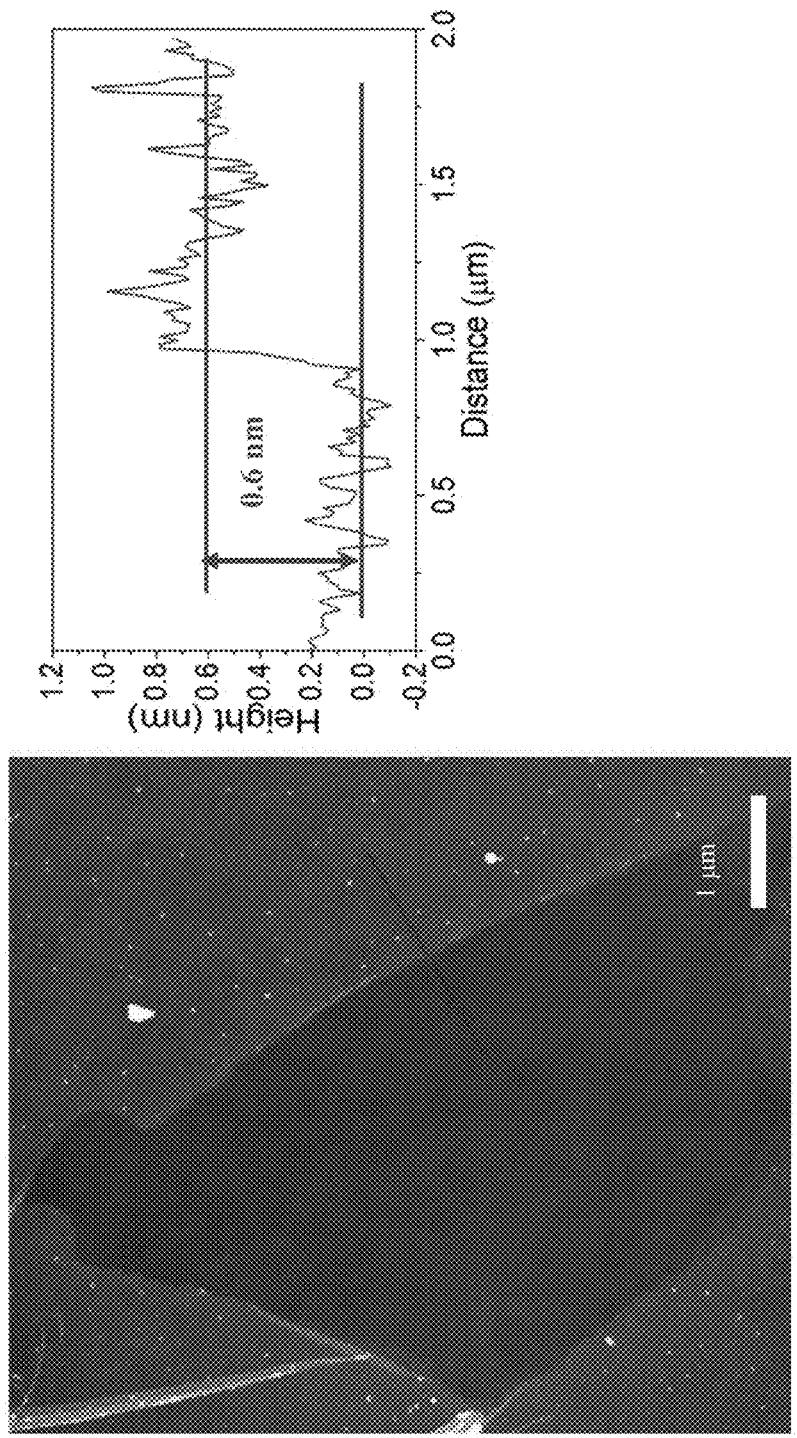
FIG. 3 illustrates a measured thickness of the disclosed carbon film on boron nitride by Atomic Force Microscopy (AFM), according to one embodiment of the present disclosure.

FIG. 3 illustrates a measured thickness (i.e., the height) of the isolated disclosed 2DAC film on boron nitride (BN) by AFM. Based on the disclosed invention, the following properties apply: FIG. 3 shows the AFM of the disclosed transferred 2DAC film to boron nitride (BN). The disclosed thickness of the 2DAC is approximately 6 Å, comparable to graphene which is only one atomic thick (thickness ranges from and including 3.3 Å to 10 Å when measured on BN). The thickness is also corroborated by the TEM image in FIG. 1. Further, the film is found to be homogenous.

Figure 4:
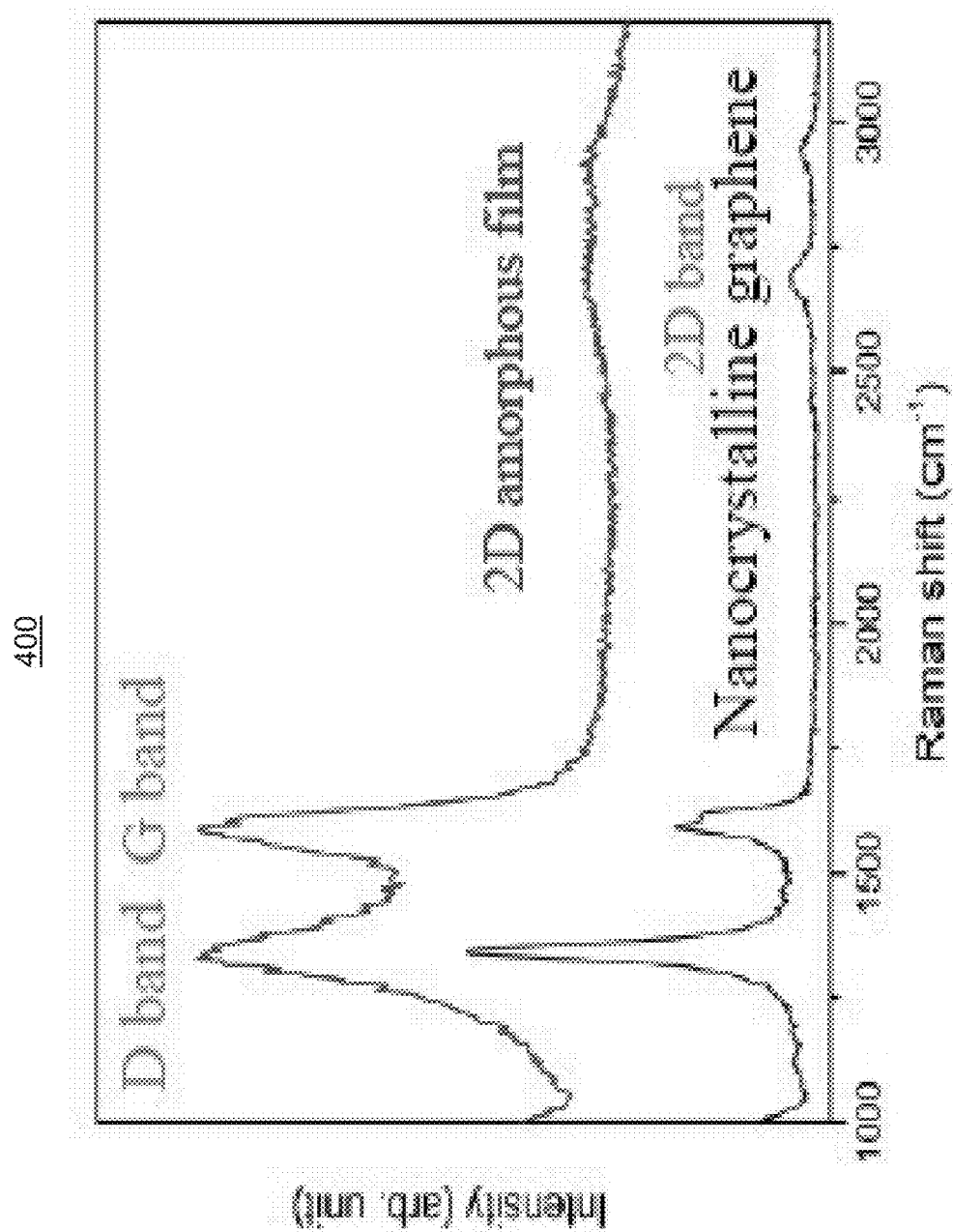
FIG. 4 illustrates a Raman spectra of amorphous film and nano-crystalline graphene on $SiO_2$, according to one embodiment of the present disclosure.

FIG. 4 illustrates Raman spectra 400 of amorphous film and non-crystalline graphene on $SiO_2$. Raman spectroscopy of the isolated film showed no 2D peak (~2700 cm-1), but instead showed broad G (at ~1600 cm-1) and D peaks (at ~1350 cm-1). The broadening of D and G peaks usually indicates a transition from nanocrystalline graphene to amorphous film as was previously reported.[4] From the intensity ratio of the D and G peaks, the domain size is estimated to be in the order of 1-5 nm.[4] Raman spectroscopy serves as a characterization tool to represent the TEM image in FIG. 2 in large area.

Figure 5:
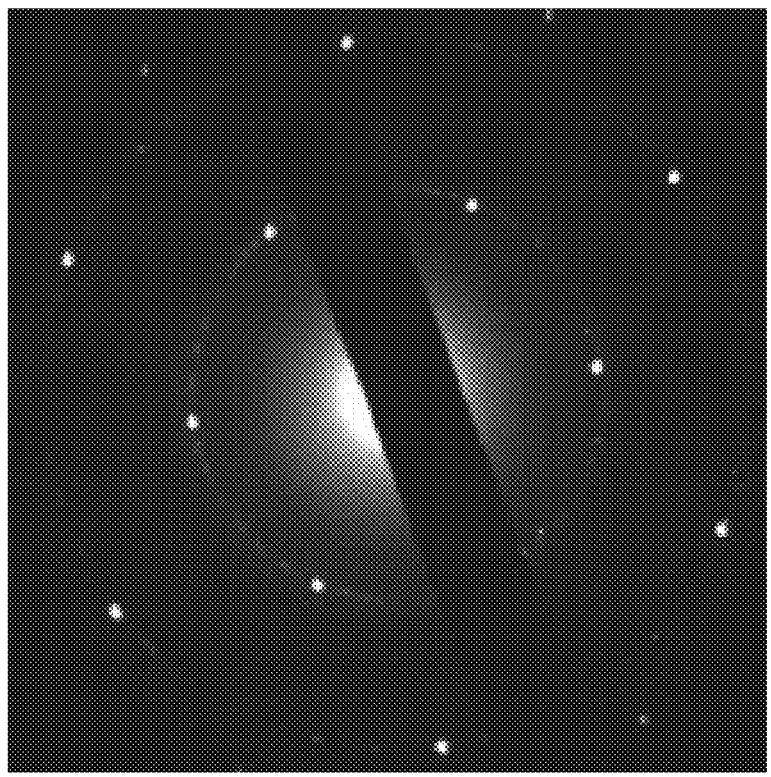
FIG. 5 illustrates TEM diffraction of atomically thin amorphous carbon (left) and graphene (right), according to one embodiment of the present disclosure.
Figure 5:
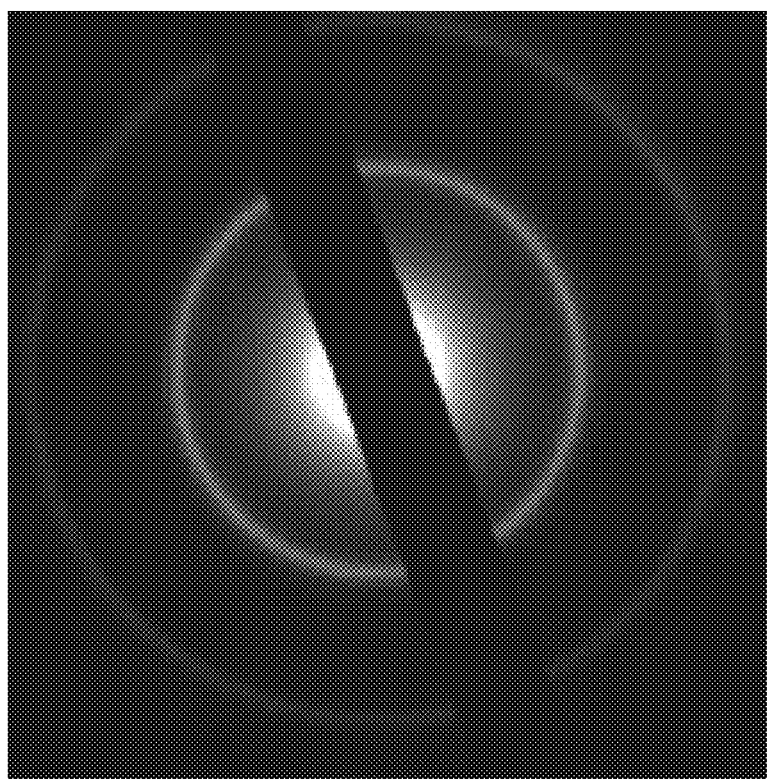

FIG. 5 provides a comparison 500 of TEM diffraction of atomically thin amorphous carbon (left) and graphene (right), according to one embodiment of the present disclosure. Further evidence on the amorphous nature of the disclosed isolated film is corroborated by the TEM diffraction, where no clear diffraction spots are detected which is in contrast to graphene wherein diffraction spots are clearly seen indicating crystallinity. The diffraction rings in FIG. 7 (top) indicates a domain size of <5 nm. The diffraction data of the amorphous film is consistent with the FFT image in FIG. 2. In this case, the 2DAC film is free-standing.

Figure 6:
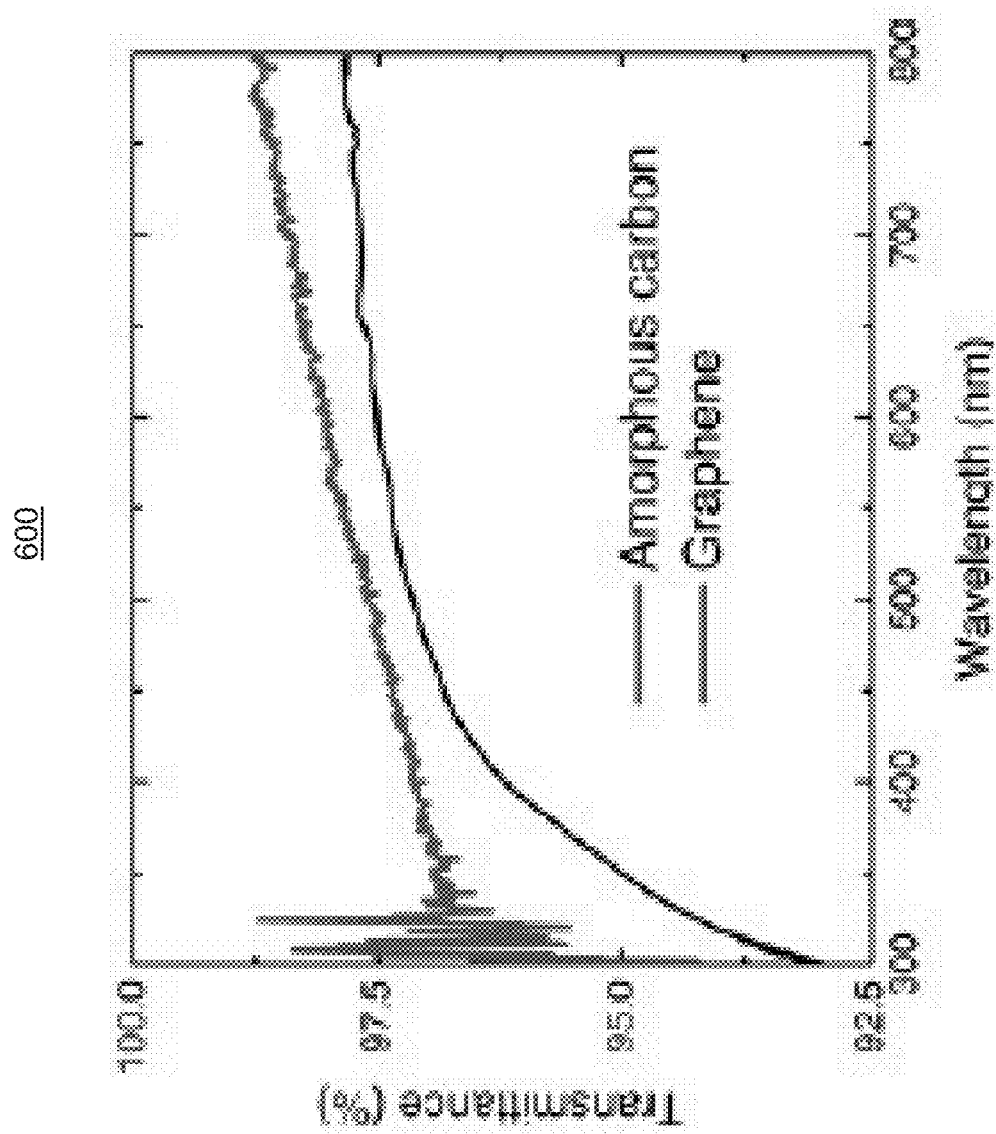
FIG. 6 illustrates the transmittance of the disclosed carbon film, according to one embodiment of the present disclosure.

Turning to FIG. 6, a graph 600 illustrates the transparency of the disclosed carbon film, according to one embodiment of the present disclosure. The optical transparency is at 98% at 550 nm light wavelength, increasing in transparency with increasing wavelength. Thus, select embodiments provide an optical transparency equal to or greater than 98% at a wavelength of 550 nm or higher. Again, the disclosed carbon film differs from graphene as the transparency of graphene at a single layer is at a maximum of 97.7% throughout the visible wavelength (400 nm-700 nm, inclusive), and decreases as the number of layer increases. Notably the transparency of the 2DAC film does not decrease rapidly at short wavelengths (<400 nm) as seen in graphene.

Figure 7:
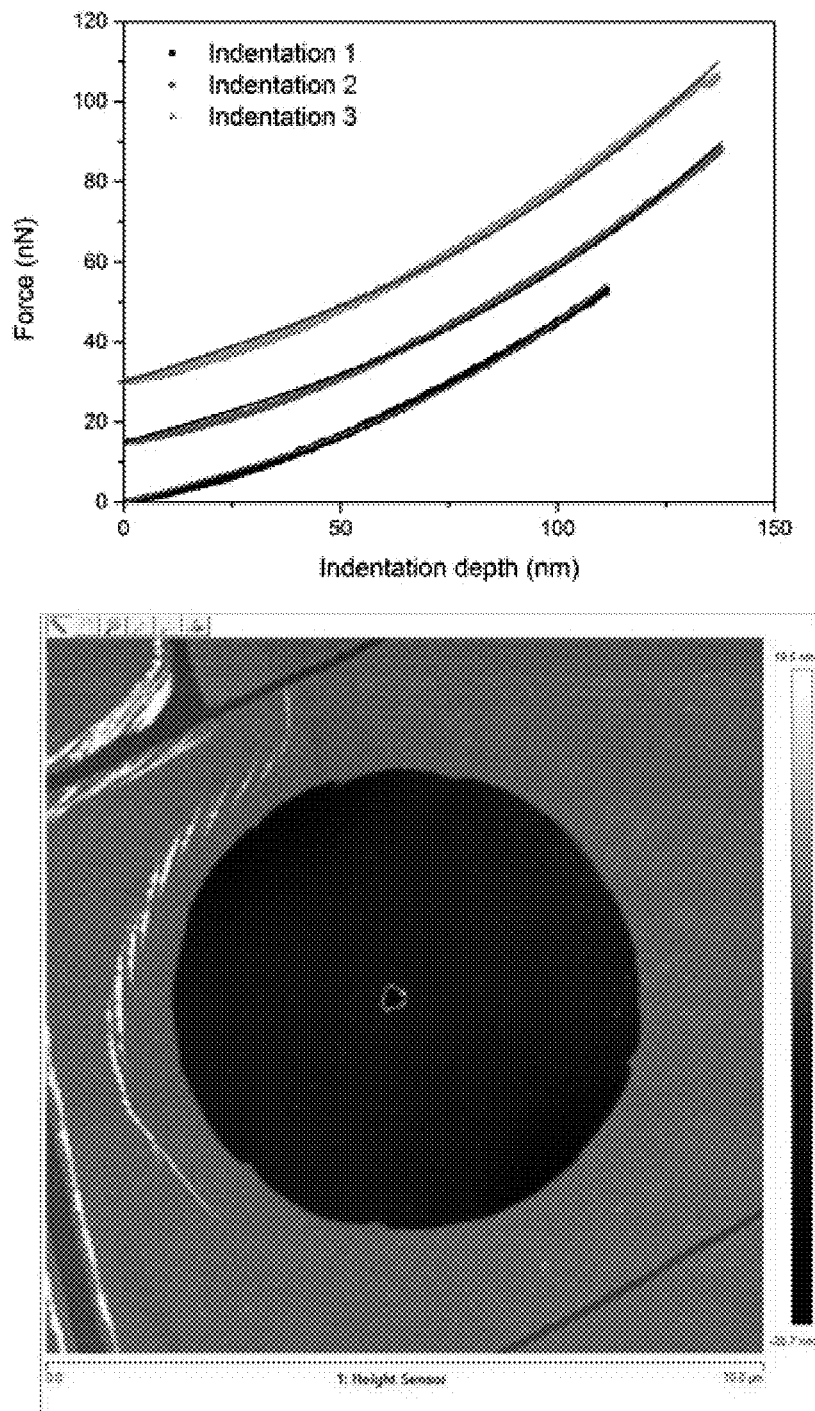
FIG. 7 illustrates a mechanical property of a 2D amorphous film and a demonstration of suspended carbon film, according to one embodiment of the present disclosure.

The elastic modulus, E, of the suspended film is above 200 GPa, higher than bulk glassy carbon (E=60 GPa).[5] The ultimate strain before mechanical failure is 10%, much higher than that of other amorphous carbon reported. FIG. 7 illustrates non-indentation on suspended carbon film and suspended carbon film after exertion of ultimate stress by an Atomic Force Microscope (AFM) (e.g., Bruker model no: MPP-11120) tip. The amorphous property of the disclosed 2DAC film prevents collapse of the suspended film in FIG. 7 (bottom). Instead, the film displays a ductile response to ultimate stress levels.

Figure 8:
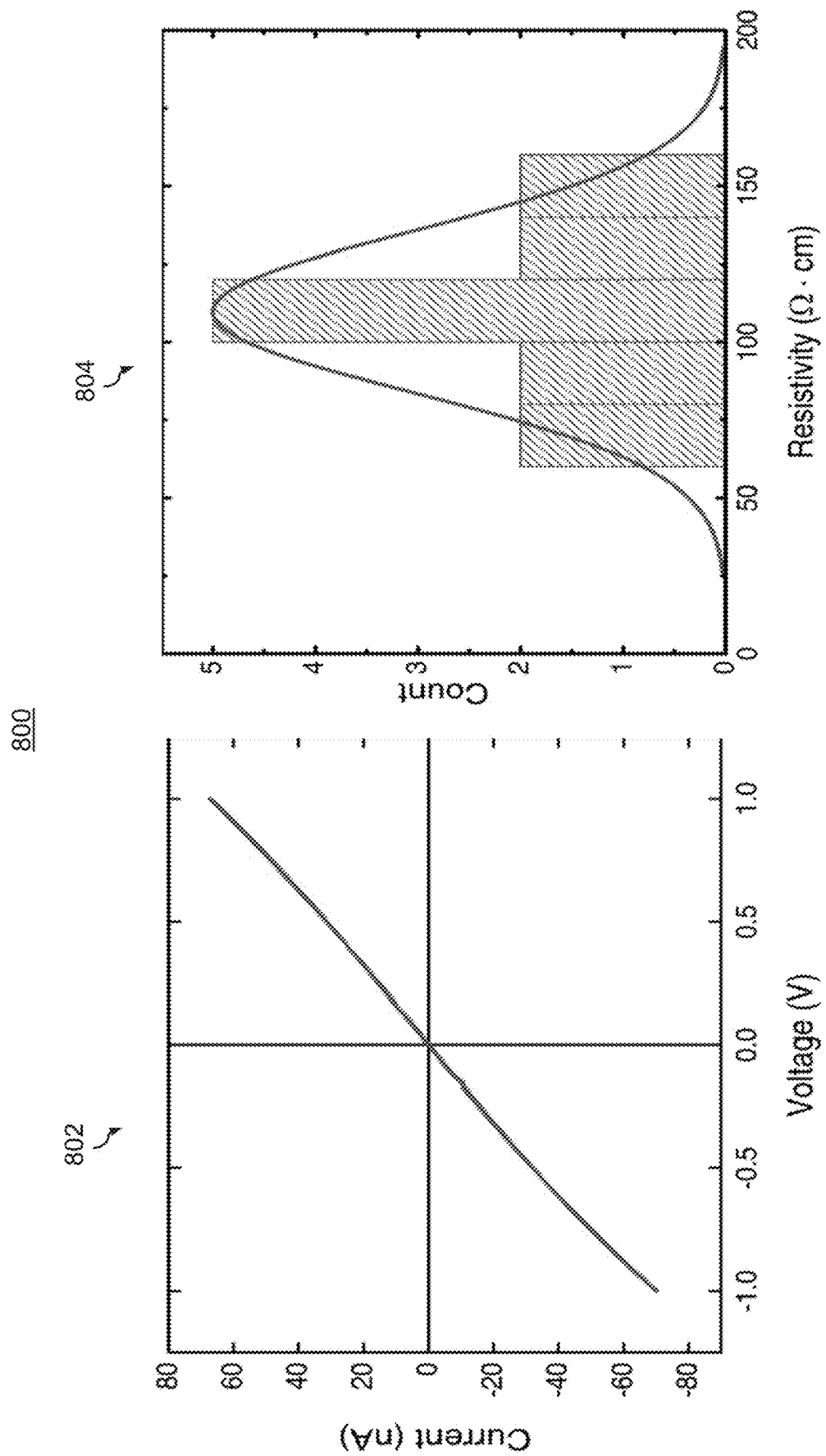
FIG. 8 illustrates electrical properties of a 2DAC, according to one embodiment of the present disclosure.

The 2DAC thin film of the disclosed invention is highly resistive with electrical resistivity ranging from 0.01 to 1000 $\Omega$-cm, depending on the value of C, which is tuned by the growth conditions. FIG. 8 is a schematic illustration 800 of electrical properties of a 2D amorphous carbon, showing an I-V curve 802 of the 2D amorphous film and a histogram 804 of the measured resistivity values for a particular C value. A measurement technique/method is used towards generating a resistivity value. A ratio is used within the calculation from the data of I-V curve 802 to obtain each resistivity data point in histogram 804. Accordingly, length: width ratio for the 2D amorphous carbon in FIG. 8, left is 1:100. In comparison, graphene has resistivity value of ~$10^{-6}$ $\Omega$-cm while bulk glassy carbon (also 100% C—C $sp^2$) has values ranging from 0.01 to 0.001 $\Omega$-cm.

The monolayer film, containing n-membered rings >6, is naturally a membrane that can selectively pass gases, ions, liquids or other species whose sizes are small enough to pass through the 7-,8-,9-membered rings. In particular, the disclosed 2DAC film can pass through proton 10× more efficient than crystalline monolayer boron nitride at room temperature.[6] For the disclosed 2DAC film, the resistivity to proton flow across the membrane is from 1-10 $\Omega$-$cm^2$ at room temperature.

Figure 9:
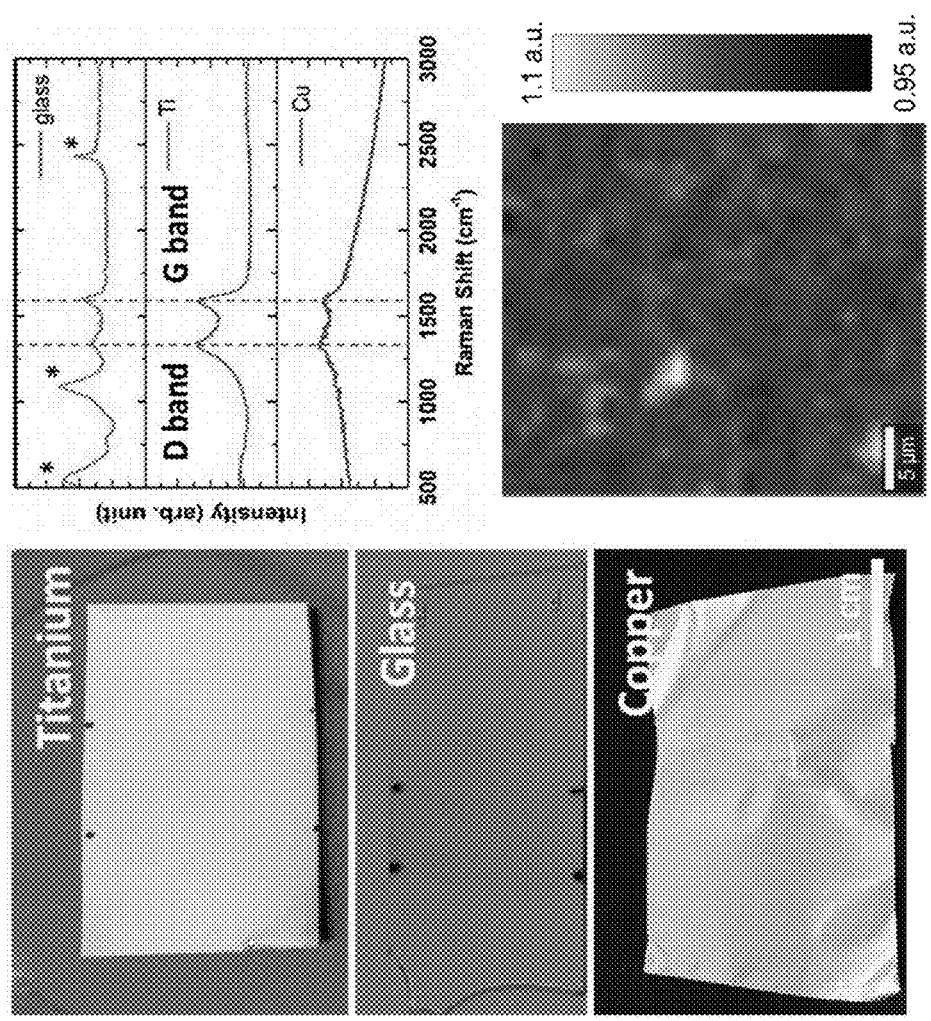
FIG. 9 illustrates composite material grown on different substrates, according to one embodiment of the present disclosure.

FIG. 9 illustrates composite material grown on different substrates, according to one embodiment of the present disclosure. Pictures of titanium, glass and copper coated with atomically thin amorphous carbon are illustrated on the left. In the upper right, shown is the Raman spectra from the coated regions showing similar response irrespectively of the substrate. Finally, in the lower right, shown is the Raman map of G/D peak ratio of the 2DAC film on top of the titanium shown its full coverage. The disclosed composite material (i.e., the disclosed 2DAC and the substrate) can be created from any metal (catalytic or non-catalytic) or on glass or oxides. Thus, disclosed embodiments provide that the 2DAC may be grown directly on any of the disclosed desired substrate materials. This is different from graphene, which can only be grown on a catalytic substrate, e.g., copper, and requires transfer to all other substrates. Accordingly, compared to deposition methods of amorphous or diamond-like carbon, whose thickness cannot exist lower than 1 nm to still be considered continuous, the disclosed composite material comprises an atomically thin (<1 nm) and continuous layer of two-dimensional amorphous carbon that is strongly bonded to a host substrate.

In general, when a film on a substrate has poor adhesion, areas of the film may become detached from the substrate and, therefore, will provide poor or little protection of the substrate. Accordingly, embodiments of the present disclosure provide an improved film which provides uniformity and strong adhesion over the entire applied surface of a substrate. Accordingly, the disclosed 2DAC film is formed as a continuous film over, preferably, substantially the entire substrate surface or at least the applied surface. Unlike conventional designs, such as graphene, for example, in Cu, which can be detached easily (e.g., the adhesion force is from 10-100 J/m2), the disclosed atomically thin 2DAC film disposed, for example, on Cu adheres very well to the substrate with an adhesion energy >200 J/m2.[7] This example provides further evidence to differentiate the disclosed 2DAC film from graphene. (While an exemplary embodiment of a Cu substrate is described, embodiments of applying the disclosed 2DAC to any substrate may be applied in accordance with disclosed embodiments of the invention.) Furthermore, the adhesion energy is evident in all substrate materials onto which the disclosed 2DAC film is grown including, for examples, stainless steel, titanium, glass, nickel, and aluminum substrates. It should be appreciated that the above substrates are exemplary and the teachings of this disclosure may be applied to any substrate desired.

In general, any attempts for transferring any 2D material to a material by convention materials and processes have previously led to defects and cracks, for example, in the transferred material(s) and also a reduction of coverage on the substrate. This is, at least in part, due to the fact that the transfer process generally employs many mechanical steps and may use chemicals that induce cracks and defects in conventional film applications. The disclosed 2DAC film, however, does not need to be transferred, for example, from a growth substrate to a target substrate. In addition to the improved adhesion properties of the disclosed 2DAC film, enhanced characteristics of the disclosed 2DAC film provide and ensure consistent and full coverage directly across/over the substrate. Consistent and full coverage is thereby obtained, at least, because, there is no need to transfer the disclosed 2DAC film, since it is fully capable of consistently and successfully being grown directly on its host substrate.

Designed to provide such dependable coverage, together, along with its superior mechanical properties for adhesion to substrates (such as carbon), the disclosed 2DAC film is very suitable and dependable for applications that require additional physical characteristics/requirements of the 2DAC film and composite. Such physical characteristics may include the ability of the disclosed 2DAC film and/or composite to bend and/or stretch. The adhesion properties and ability of the disclosed 2DAC to the substrate ensures this is the case. If there is non-uniform adhesion to the substrate, like for transferred films, cracks in the film will form at regions of poor adhesion and are causes prone to failure.

Accordingly, embodiments of the disclosed invention provide the top amorphous carbon film 102 covering the whole substrate 104 upon which it is grown (Raman map of FIG. 9) making it very useful for applications that require, for example, carbon coating. The top amorphous carbon film 102 also serves as a diffusion barrier without defects thereby preventing the underlying substrate from oxidation and corrosion. Due to electrically insulating properties, the disclosed amorphous carbon film 102 prevents any galvanic corrosion of substrate 104. The low electrical conductivity of the disclosed 2DAC is beneficial to cell attachment and proliferation as observed in recent reports.[8] Cells on conductive substrates adhere to the surface through electrostatic interactions without creating focal adhesions. Focal adhesions are crucial to cell proliferation and growth and a low electrical conductivity is preferred for focal adhesion development and cell proliferation. The low electrical conductivity is a consequence of the amorphous nature of the disclosed 2DAC as observed through the Raman spectroscopy D/G peak intensity and the $sp^3/sp^2$ ratio.

In contrast, graphene is known to worsen long term corrosion.[9] The transfer of graphene makes it nearly impossible to create a flat continuous film without creating cracks and defects along the surface. The disclosed amorphous carbon film 102 material is a composite with substrate 104, hereby eliminating the need for transfer as well as removing the risk of cracks in the film 102.

Figure 10:
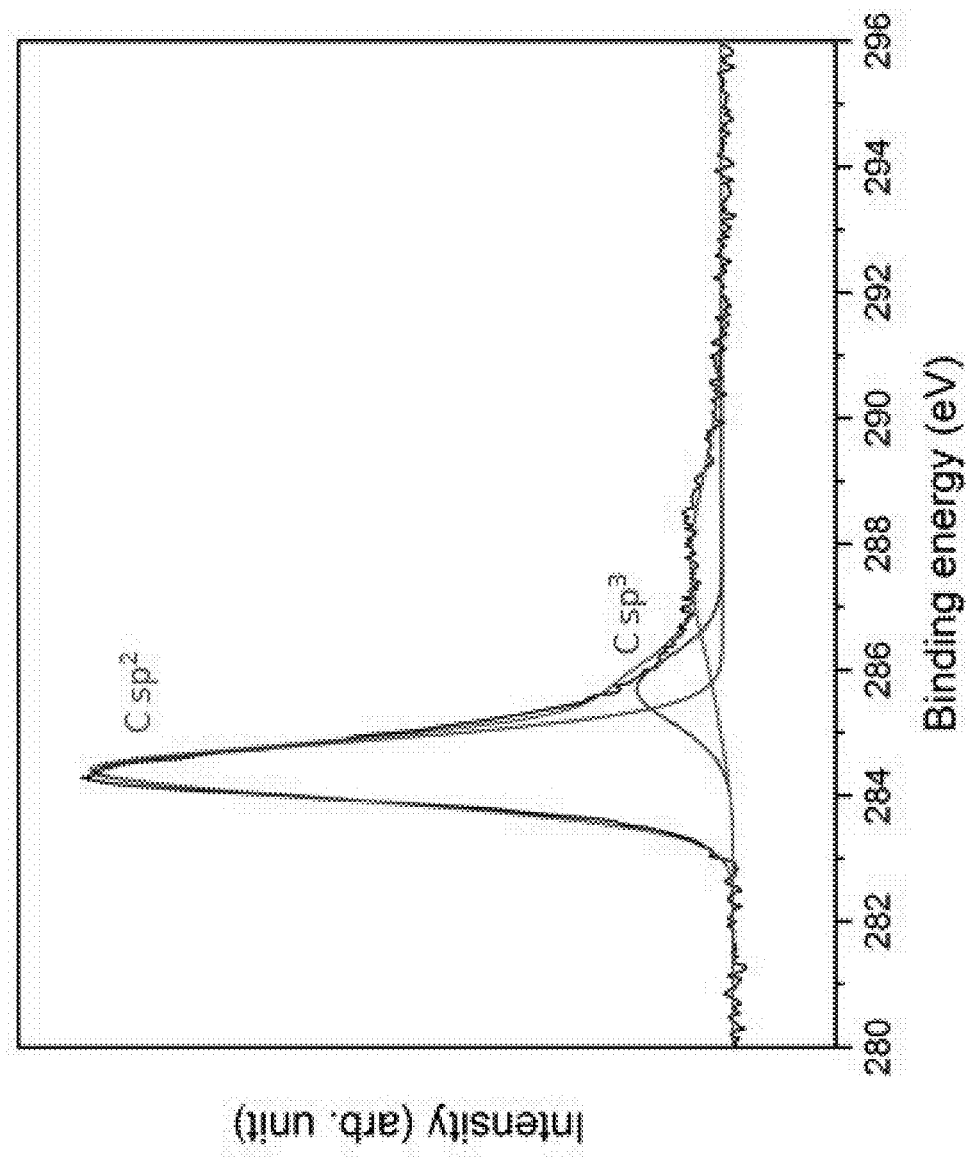
FIG. 10 illustrates X-ray photoelectron spectroscopy (XPS) of a 2DAC on Cu, according to one embodiment of the present disclosure.

The disclosed 2DAC film consists of $sp^2$-bonded carbon similar to glassy carbon; however the thickness is only approximately one atomic layer thick (6 Å), thinner than any conventional reported amorphous carbon structure. FIG. 10 illustrates the X-ray photoelectron spectroscopy (XPS) measurement of 2D amorphous carbon on Cu, where the peak position indicates the $sp^2$ or $sp^3$ bonding type while the peak intensity indicates the fraction of each type of bonds. A mix concentration of C—C $sp^2$ and $sp^3$ bonding is also possible without sacrificing the thickness, though the maximum C—C $sp^3$ content is set to 20%. The thin structure and strong adhesion of the disclosed 2DAC intrinsically protects the underlying substrate all the time, unlike in thicker films where the possibility of flaking off is evident.[10]

According to disclosed embodiments, a laser-based growth process, using hydrocarbons as precursors (such as $CH_4$, $C_2H_2$, etc.) produces the disclosed composite film. Hydrogen gas ($H_2$) and Argon gas (Ar) may also be mixed with the precursor. In this process, the laser has two roles: (1) an energy source to breakdown the precursor gas in a process called photolytic decomposition; and (2) as a local heat source. Assuming that one or both aforementioned roles produces the disclosed 2DAC film: in the first case, the substrate 104 is said to be at room temperature throughout the growth; in the second case, the laser can heat up the substrate 104 up to 500° C. Typically, a pulsed excimer UV laser (e.g., 193, 248 or 308 nm) can be directed onto or parallel to the substrate at a fluence from about 50-1000 $mJ/cm^2$ at different growth times, depending on the employed substrate. Other possible combinations to produce the disclosed composite may include utilizing any combination of a laser, plasma, and/or a substrate heater. A heater may be employed to heat the substrate 104 up to 500° C. Plasma power may be used in the range of and including 1-100 W. A typical combination using hydrocarbon as precursor will be as follows: (i) Laser only; (ii) Laser+low power plasma (5 W); (iii) Laser+low power plasma (5 W)+heater (300° C.-500° C.); (iv) Low power plasma (5 W)+500° C. heater; (v) High power plasma (100 W) only.

According to disclosed embodiments, the entire growth/deposition of the disclosed 2DAC and 2DAC composite may be performed within a chamber. Modules for heating, plasma, gas flow and pressure control may all be set and established within the chamber for the controlled growth environment. According to one embodiment, the process pressure of the chamber may be established in a range of, and including, 10 to 1E-4 mbar.

The process parameters for the disclosed 2DAC may include the following: (i) process gas: $CH_4$ (ii) chamber pressure: 2.0 E-2 mbar; (iii) laser fluence: 70 $mJ/cm^2$; (iv) growth time: 1 min; (v) plasma power: 5W; (vi) substrate: Cu foil.

A process for producing the disclosed 2DAC film may employ the use of methane ($CH_4$) within the growth chamber for the growth process. The gas pressure within the chamber during the growth is controlled at 2 E-2 mbar throughout. This gas is in the presence of a plasma generator operating at 5 W power. The growth starts when the 248 nm excimer laser is exposed on the surface of the copper foil substrate with a fluence of 70 $mJ/cm^2$ with a pulse frequency of 50 Hz. The laser exposure time (i.e., growth duration) is set at 1 min to obtain a continuous 2DAC coating on the substrate. In this growth, the stage heater is not used. Multiple parameters disclosed herein may be adjusted, for controlling and/or changing the properties of the disclosed 2DAC including, but not limited to, hydrocarbons as precursors, precursor mixes, adjustments to the photolytic decomposition process and equipment, temperature regulations, substrate temperature adjustment, the change in C value, change in number of atomic layers, change in $sp^2$ to $sp^a$ ratio, and change in adhesion to substrate.

The disclosed carbon film may be constructed with minimal thickness thereby ensuring that the disclosed metal surface of the substrate is consistently and completely covered during the lifetime of applied usage. In one exemplary embodiment, the disclosed 2DAC thickness may be designed at approximately one atomic layer thick. The disclosed carbon film 102 may be grown directly on several substrates 104, for example, such as stainless steel and titanium materials. Since the growth is done at much lower temperature than, for example, graphene synthesis, the disclosed 2DAC may be grown directly to other substrates 104 that cannot withstand high temperature like glasses and hard discs.[11] The disclosed 2DAC film 102 is ultra-strong and is strongly bounded to the substrate 104 making it suitable for applications that may require deformation such as bending and stretching. The strong mechanical properties of the disclosed 2DAC film is due to its lack of grain boundaries. The insulating property of the disclosed carbon film 102 prevents galvanic corrosion of the substrate 104 unlike graphene which enhances the corrosion. The 7-,8-, and 9-membered rings of the carbon film, as seen in the TEM image, is useful as an efficient membrane for gases or for proton transport.[6]

According to select embodiments of the disclosed invention, the disclosed 2DAC may be generated as a free-standing case, for example, when a substrate is not suitable to be grown on, and hence the disclosed 2DAC needs to be transferred. Suitable methods and techniques for transferring the disclosed 2DAC 1202 may be employed such as dry transfer as described in the patent application: Defect-free direct dry delamination of cvd graphene using a polarized ferroelectric polymer WO2016126208A1. Other transfer methods may include, but not limited to, thermal release tape, pressure-sensitive adhesive, spin coating, spray coating, and Langmuir-Blodgett technique.

However, additional advantages of the present disclosure provide that, in some embodiments, the disclosed 2DAC may be directly grown on a substrate. Such benefits of the disclosed 2DAC film compared, for example, to graphene for the transfer process is that the disclosed 2DAC film does not require a sacrificial support layer for transfer (unlike graphene). With graphene, the film layer is required to prevent cracks and defects during the transfer, and the film layer needs to be removed after. Even with removal, there residues remain from the sacrificial layer that cannot be completely removed. With the disclosed 2DAC, the transfer can be done without the sacrificial layer, without inducing defects and without dealing with residues or compromising the structure.

Advantages of the disclosed embodiments of the 2DAC layer may be implemented in a wide variety of applications including, but not limited to, an amorphous carbon overcoat layer employed in HAMR media technology, for example, as a protectant for an underlying magnetic recording layer. Such applications make use of the advantages of the disclosed 2DAC layer including, for example, an exemplary single layer of carbon atoms in a non-crystalline structure having a C-value below or equal to 0.8. Referring, again, to the amorphous nature of the disclosed 2DAC layer, such as the 2DAC film shown in FIG. 2, the continuous film of carbon is arranged in a random patterned that allows for an ultra-high transverse conductance of protons between approximately 0.1-10 S/cm$^2$.

Figure 11:
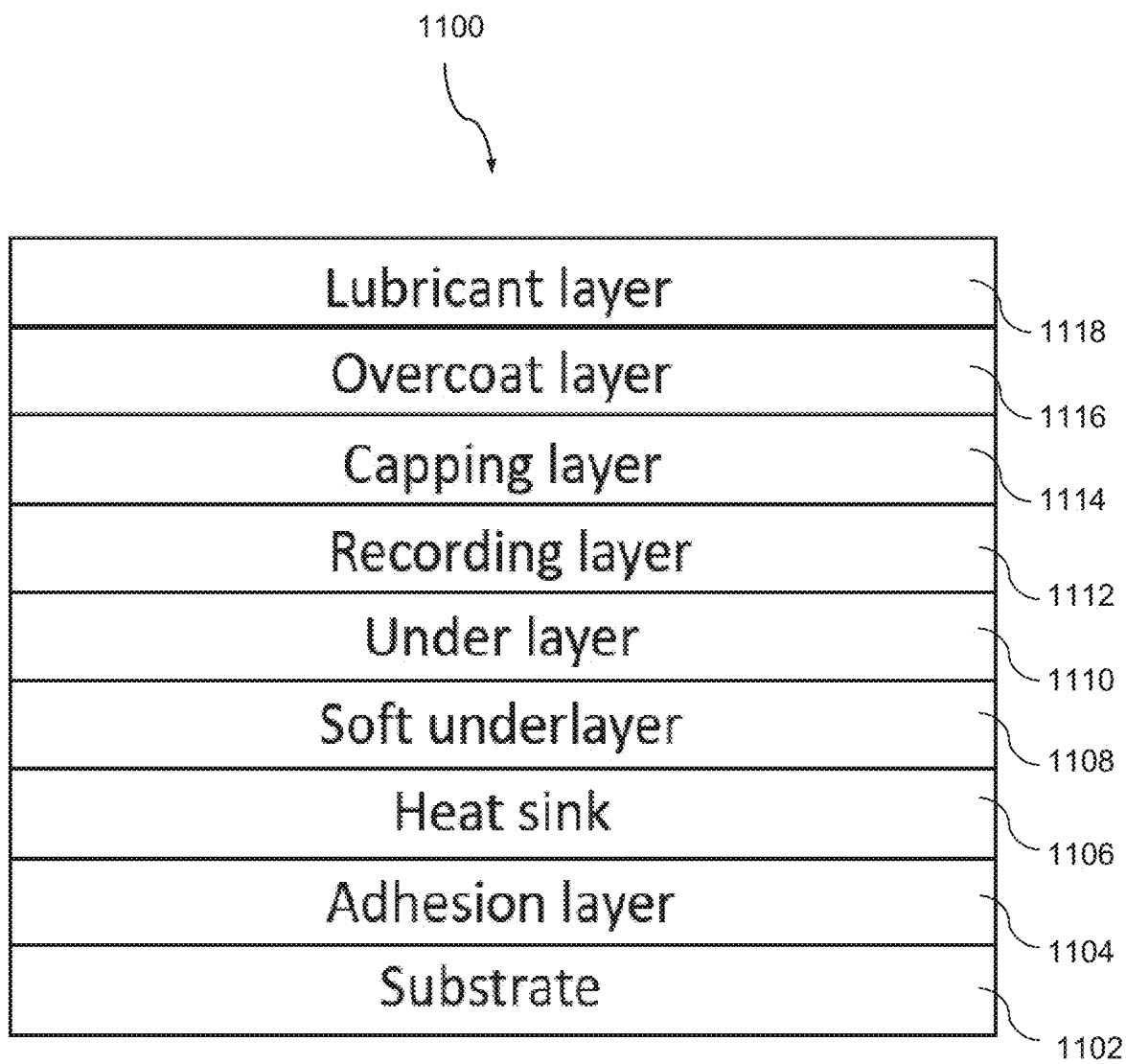
FIG. 11 illustrates an exemplary cross section of magnetic disk used in HAMR technology, according to one embodiment of the present disclosure.

Embodiments of the disclosed invention provide an overcoat layer protecting an underlying magnetic recording layer of a HAMR media. The overcoat layer may be employed as the disclosed 2DAC layer described above. FIG. 11 illustrates an exemplary a side cross section view of a HAMR recording device 1100, according to one disclosed embodiment. It is readily appreciated that the thickness of the exemplary HAMR device 1100 illustrating the disclosed layers is not necessarily to scale of an actual device. In an exemplary embodiment, an overall construction of the HAMR device 1100 may include a substrate layer 1102, an adhesion layer 1104, a heat sink layer 1106, a soft under layer 1108, another under layer 1110, a recording layer 1112, a capping layer 1114, an overcoat layer 1116, and a lubricant layer 1118.

Substrate layer 1102 may comprise glass, metallic substrates such as aluminum, or other base material such as an oxide of a material. An adhesion layer 1104 may be utilized, for example, to reduce delamination of top layers and improve flatness.[1,15] A heat sink layer 1106 may be disposed on adhesion layer 1104 and is provided to dissipate heat such as from an employed laser, for example, during a HAMR operation. A soft under layer 1108, such as a soft magnetic layer, may be disposed, for example, over seat sink layer 1106 to provide a return path for the magnetic flux during operation. In some disclosed embodiments, another under layer 1110 may be utilized, for example, being disposed over soft under layer 1108. Under layer 1110 may include a barrier layer and a seed layer and ordering temperature reducing layer in different arts. A recording layer 1112 may be disposed over under layer 1110. A capping layer 1114 may be employed and disposed over recording layer 1112. Capping layer 1114 utilizes magnetic material while providing protection to the recording layer. An overcoat layer 1116, such as the disclosed 2DAC layer described above, may be disposed over capping layer 1114. Thus, overcoat layer 1116 may be regarded as the disclosed 2DAC overcoat to provide anti-corrosion and anti-wearness protection. A lubricant layer 1118 may be employed over overcoat layer 1116 to reduce friction between the head and media surface to thereby reduce wear of the overcoat layer 1116.

Tribological Description

In order to increase the storage areal density of the magnetic recording media, smaller magnetic bits are required. With the reduction in the size of magnetic bits, the magnetic signal will also be reduced and cause a degraded signal-to-noise ratio. To increase the signal-to-noise ratio, disclosed embodiments require the reading head be brought closer to the magnetic recording media. The overcoat layer 1116 of the disclosed invention may include a thickness of approximately one atom to a thickness of a few atoms. Thus, the aforementioned thickness range may include a thickness of approximately 0.2 nm to about 2 nm. The thickness range of the disclosed overcoat layer 1116 may significantly reduce the lower limits of the magnetic bit size. Thus, the overcoat layer 1116 of the present disclosure may consist of one atomic layer of carbon in one embodiment and few layers of carbon in another embodiment. The disclosed overcoat layer 1116, such as the 2DAC layer of the present disclosure, may be disposed over capping layer 1114. Overcoat layer 1116 is designed to provide improved adhesion properties to the applied surfaces while maintaining a low surface roughness. In some embodiments, the deposition of the overcoat layer 1116 on the recording surface roughness is less than 1A.

Anti-Corrosion

Figure 12:
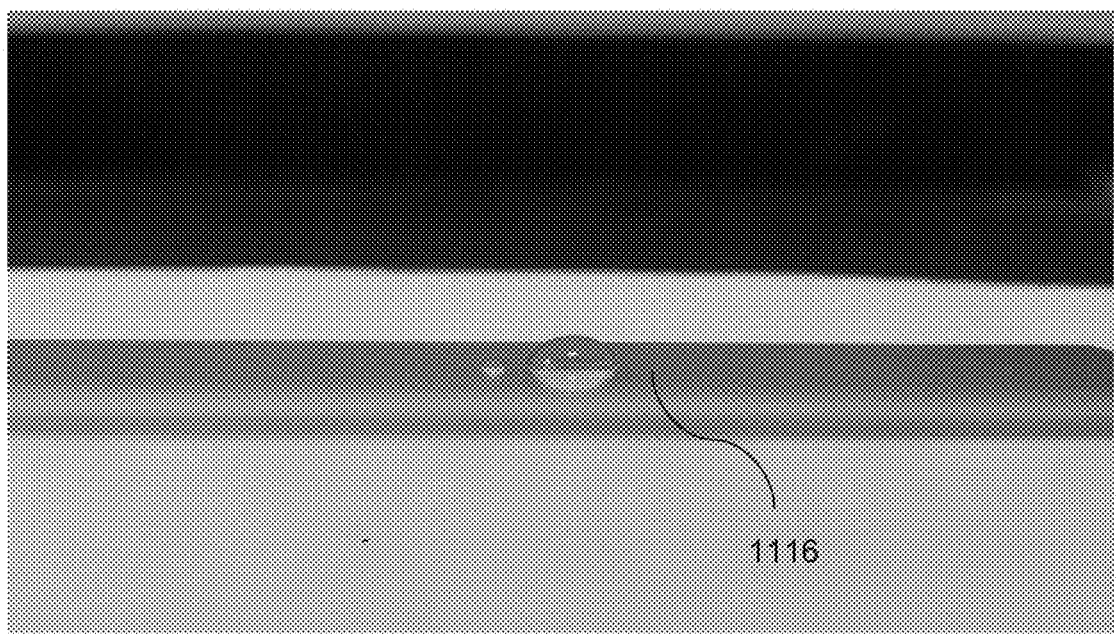
FIG. 12 illustrates an exemplary water contact angle of the disclosed overcoat layer, according to one embodiment of the present disclosure.

In disclosed embodiments, the hard disk may contain all or some of the following layers: capping layer 1114, carbon overcoat layer 1116 and lubricant layer 1118. One main function of the aforementioned layers is to protect the hard disk from corrosion by the surrounding environment. This is especially true for magnetic hard disks subjected, for example, to HAMR techniques, where the magnetic hard disks experience thermal environments exposed to elevated temperatures. One of the main reasons that corrosion occurs is due to water molecules in the surrounding environment. Such water molecules promote galvanic corrosion. The conductivity of the common carbon overcoat also promotes the corrosion speed by providing the return path for electrons created by oxidization of the magnetic bits. Rough surface structure will worsen the corrosion due to the capillary retention of water from a humid environment. In accordance with the disclosed technique, overcoat layer 1116 of the disclosed 2DAC possesses insulating properties. In some disclosed embodiments, overcoat layer 1116, such as the disclosed 2DAC layer, is provided having a resistivity between approximately $10^2$-$10^5$ Ω·cm which facilitates the reduction in the galvanic corrosion effect. As shown, for example, in FIG. 12, the water contact angle of overcoat layer 1116 is approximately 60, indicating a good hydrophobic surface (e.g., see FIG. 12). The hydrophobicity of the disclosed overcoat layer 1116 surface will help to reduce the formation of water menisci and, therefore, reduce attraction of water from the environment. The low roughness caused by the disclosed carbon overcoat layer 1116 will further reduce the corrosion and provides a stable storage for data.

Chemical and Thermal Stability

The carbon overcoat layer 1116, such as the disclosed 2DAC of the present disclosure, consists of more than 99% of carbon which are bonded together by C—C $Sp^2$ bond. There are less than 1% of O and H bonded to the carbon surface.

In operation, the media surface of the HAMR media may experience fast local heating and cooling. In some exemplary embodiments, a spot having a size less than 30 nanometers may be heated up to 400° C.[12] within 5 ns-200 ns and then cooled down to room temperature. For such processes, the ramping speed of the temperature may reach $10^{11}$K/S.[13,14] In prior art designs, a conventional carbon overcoat contains both Sp3 and Sp2 bonding; due to the fast temperature ramping, the Sp3 bond between the carbon atoms will undergo a graphitization transformation during which, the Sp3 bond will transfer into an Sp2 bond and thus, case clustering and a discontinuous surface. Alternatively, overcoat layer 1116, such as the disclosed 2DAC contains an Sp2 carbon bond of more than 99%. The disclosed 2DAC is stable up to 700° C. and annealing for over 2 hours. No bond change is obtained even under a high temperature ramp rate. Thus, disclosed embodiments of overcoat layer 1116, including the disclosed 2DAC, may be subject to elevated working temperatures employed by HAMR media and provide thermal stability to coated surfaces while enhancing the anti-corrosion property of the same.

Figure 13:
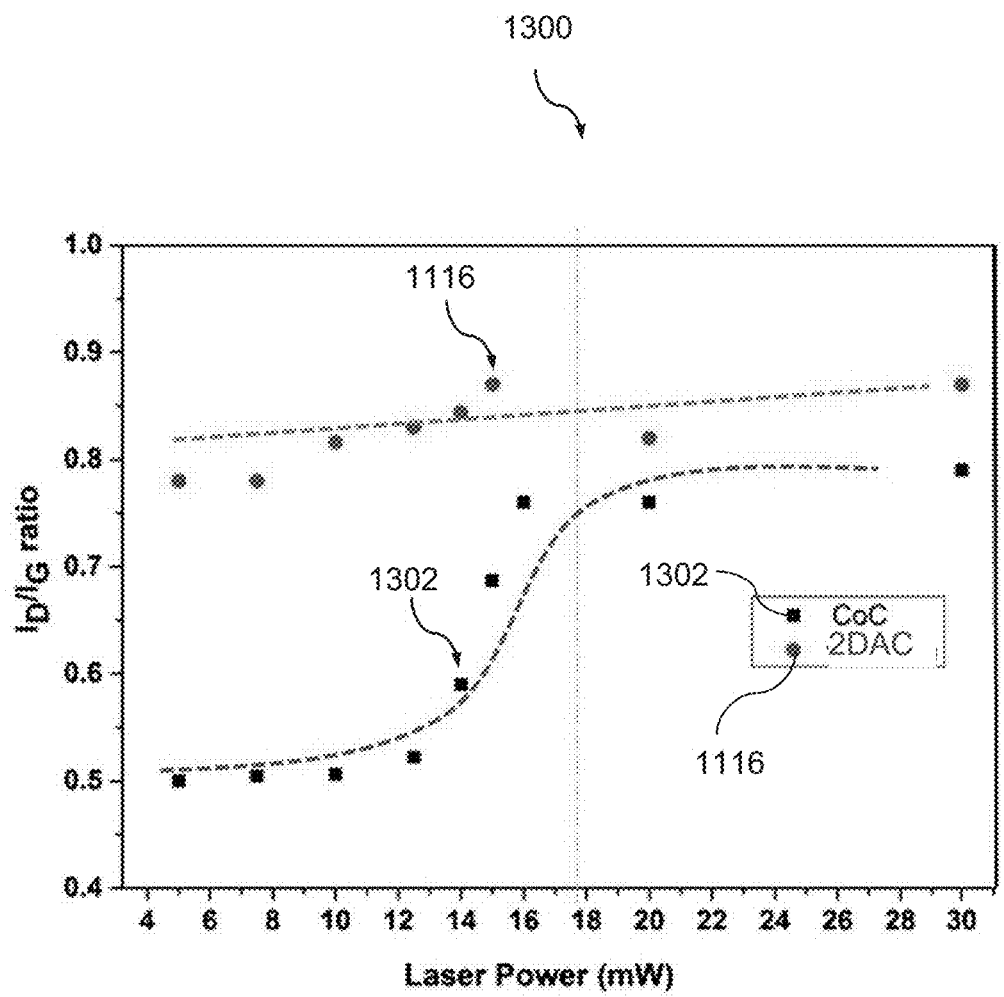
FIG. 13 is a graphical illustration comparing the thermal stability of commercial carbon overcoat with the disclosed overcoat, according to one embodiment of the present disclosure.

FIG. 13 illustrates a diagram 1300 comparing the thermal stability between commercial carbon overcoat (CoC) 1302 with the overcoat layer 1116 of the present disclosure. The figure plots the change of the ratio $I_D/I_G$ from the Raman mapping of both overcoats upon laser shining on the overcoat on hard disk. As illustrated, under increasingly prescribed laser power, the commercial carbon overcoat 1302 experiences a sudden change in the $I_D/I_G$ ratio which indicates graphitization. On the other hand, overcoat layer 1116 roughly maintains the same ratio indicating its superior thermal stability capability.

Friction

Overcoat layers also utilized within a hard disk arrangement to provide a bumper like surface. When the hard disk is in operation, there may exist contact-start-stop movement as when the slider starts to move. During the start and stop period, the read/write head will generally be in contact with the hard disk surface. Thus, a material with sufficient low friction is preferred to protect from excessive wear at the interface. Disclosed overcoat layer 1116 is designed to meet the tribology requirement to provide less friction and anti-weak surface. In one embodiment, overcoat layer 1116 includes a range of coefficient of friction (COF) of approximately 0.2-0.4 which is compatible to be utilized in place of current commercial carbon overcoat.

Transparency

Figure 14:
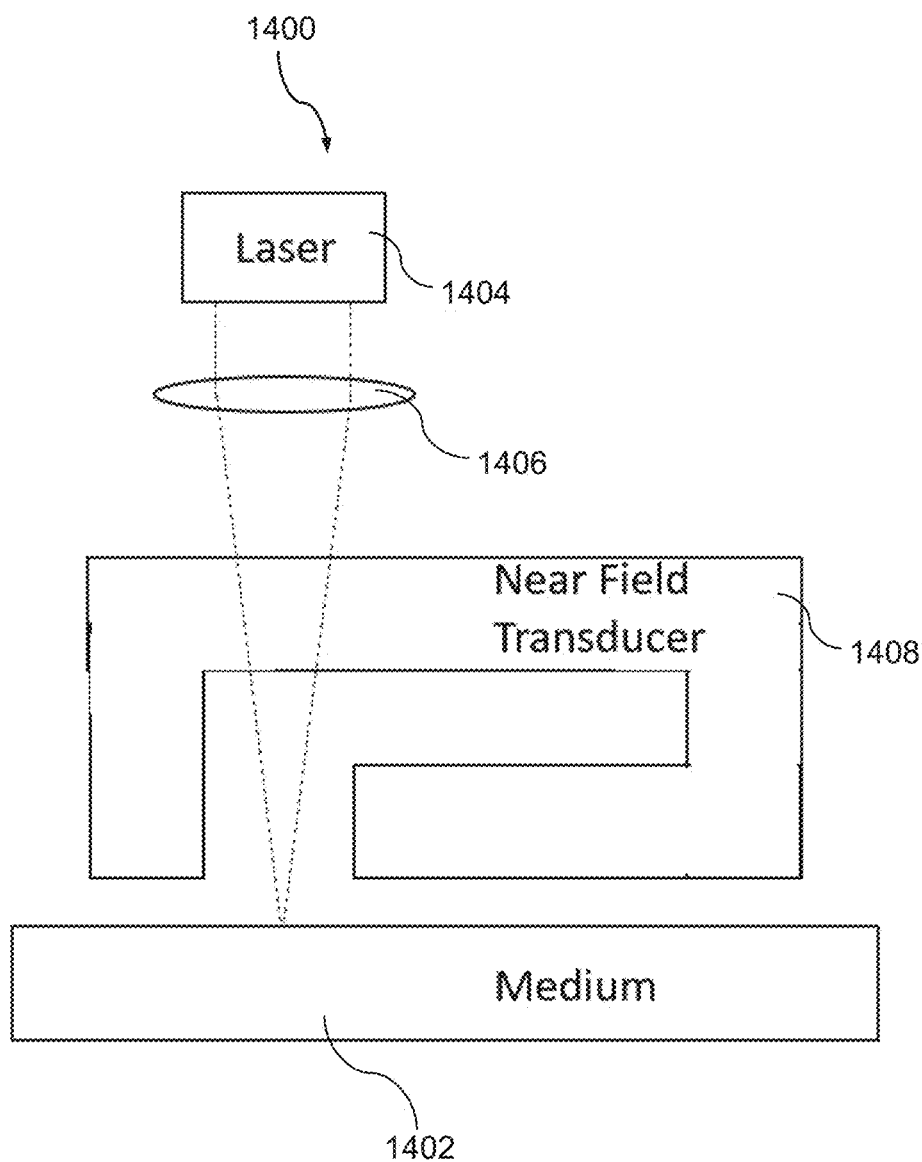
FIG. 14 is a schematic illustration depicting a design for magnetic head used in HAMR media, according to one embodiment of the present disclosure.
Figure 15:
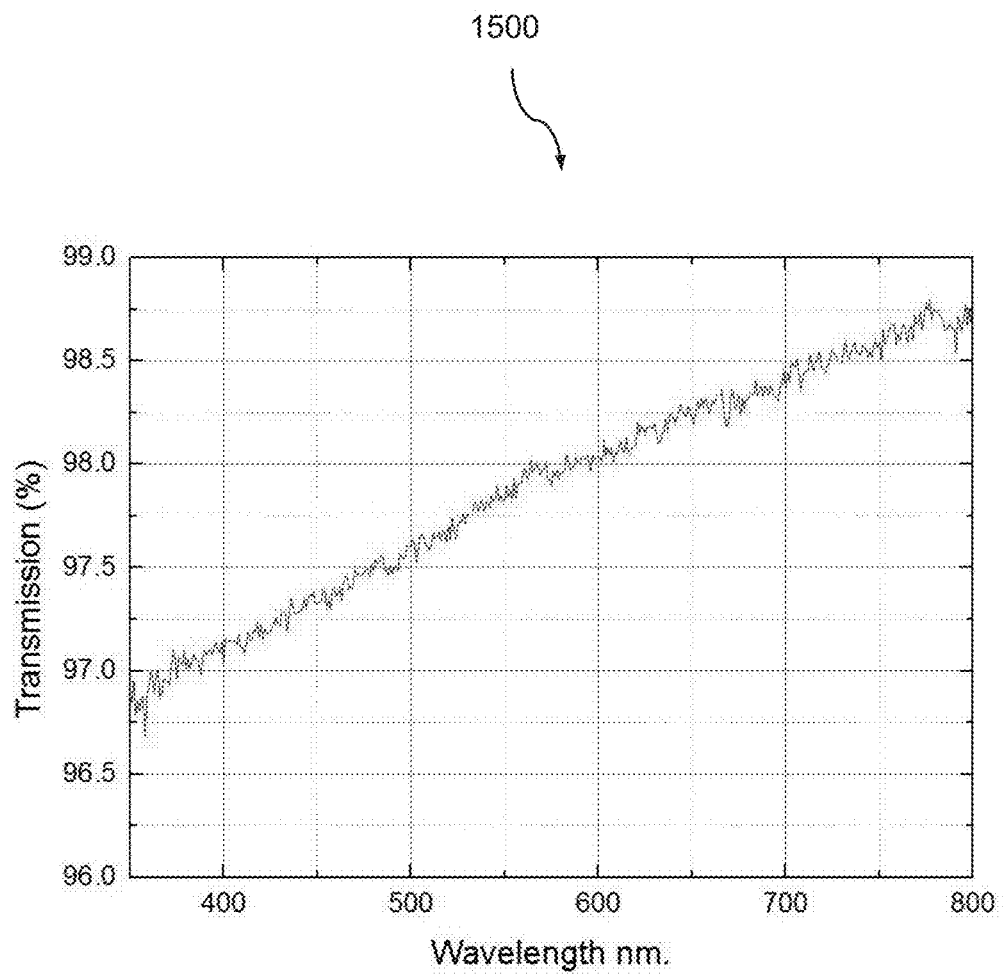
FIG. 15 is a graphical illustration comparing the reflectance of a commercial carbon overcoat with the disclosed overcoat, according to one embodiment of the present disclosure.

FIG. 14 shows an exemplary cross sectional side view 1400 of a common head design for HAMR device. The magnetic recording bit 1402 is heated by a laser 1404 during a writing operation. The laser 1404 may be directed to the interface 1406 and pass through a near field transducer 1408 which facilities focusing light to a spot size approximately less than 30 nanometers. The laser 1404 is integrated to the head and it is preferably set to achieve the lowest possible laser power both for the purpose of saving energy and easier fabrication. Laser 1404 may be either UV, visible, or infrared light. In conventional arrangements, before reaching the magnetic bit, laser 1404 will generally go through lubricant layer 1118 and overcoat layer 1116. Generally, energy loss occurs due to the reflection of the layers. For a conventional commercial carbon overcoat layer, the reflectance of the light is about 65% for light with wave number around 2000 $cm^{-1}$ (U.S. Pat. No. 8,760,980 B2).[16] The present disclosure provides a carbon overcoat layer 1116 with a reflection less than 5%, for example, in the ultraviolet (UV) region and even less in other region as shown in chart 1500 of FIG. 15. Thus, due to the embodiments of the present disclosure, the laser power required for HAMR applications is able to be reduced.

The disclosed overcoat layer 1116, such as 2DAC, possesses a high out-of-plan thermal conductivity property while also possessing a lower lateral thermal conductivity property. The vertical conductivity property of the disclosed 2DAC increases the thermal coupling between overcoat layer 1116 and the magnetic layer and also increases the heating efficiency. The low lateral thermal conductivity property of the disclosed 2DAC confines the heating locally and allows overcoat layer 1116 to achieve higher temperature gradients within a small thermal spot.

Thus, amorphous materials disclosed by present embodiments contain fundamental properties that may be regarded as possessing great practical importance. However, a basic framework of understanding, even from a theoretical point of view, is still missing from conventional dialogue and comprehension. However, the disclosed invention not only contemplates but demonstrates the synthesis of a freestanding, continuous and air stable, monolayer of amorphous carbon (MAC) by laser-assisted chemical vapor deposition.[17] Atomic scale TEM imaging reveals a fully $sp^2$ structure, with a wide distribution in both the bond length and angle with a complete lack of any long-range periodicity. The absence of crystallinity leads to an Anderson insulating phase with both tunneling and sheet resistance values similar to h-BN. In addition, and unlike in graphene, the flexibility of the disclosed carbon film strongly increases without compromising its breaking strength. Disclosed embodiments demonstrate, for the first time, the synthesis of free-standing MAC and provides crucial insights into its formation, atomic structure and physical properties. This opens up the possibility to realize wider range applications with atomically thin amorphous films, which neither can be realized with 2D crystalline materials nor with 3D amorphous materials. Examples range from heat-assisted magnetic recording (HAMR) to as a proton barrier material and even for stem cell research.

Stable, freestanding 2D MAC has not been previously reported, even though rapid advancement of the 2D field led to a broad library of 2D crystal films. Unlike their crystalline counterparts, the random bonding configuration usually resulted in an unstable film that is structurally weak and reactive. For example, ultra-thin silica glass was synthesized but consisted of a bilayer of tetrahedrals. More importantly, the interlayer van der Waals coupling to its (metallic) growth substrates, was demonstrated to be essential for its stability.[18] This makes it difficult to both establish its fundamental physics properties to explore and expand its potential for applications.

Figure 16A:
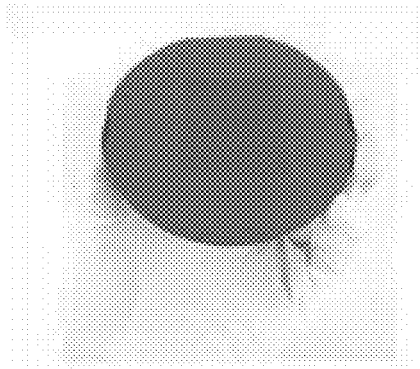
FIG. 16a is a graphical illustration of a monolayer of amorphous carbon (MAC) transferred onto a $SiO_2$/Si wafer, according to one embodiment of the present disclosure.
Figure 16B:
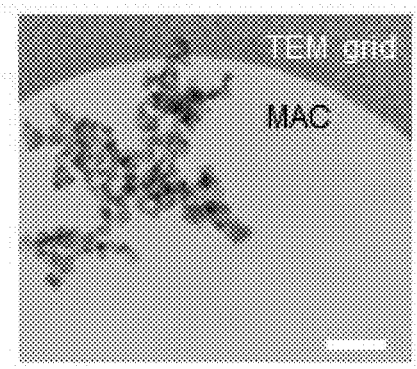
FIG. 16b is a graphical illustration of an SEM image of a MAC suspended on a TEM grid, according to one embodiment of the present disclosure.
Figure 16C:
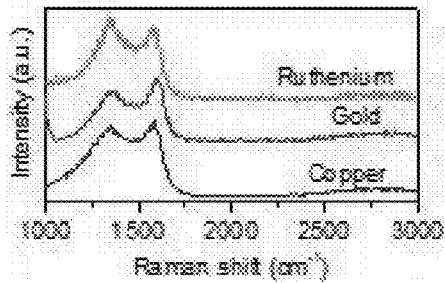
FIG. 16c is a graphical illustration of Raman spectra of the disclosed amorphous carbon grown on different substrates, according to one embodiment of the present disclosure.
Figure 16D:
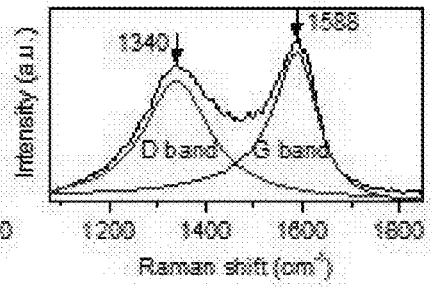
FIG. 16d is a graphical illustration of Raman spectra for Cu growth, according to one embodiment of the present disclosure.
Figure 16E:
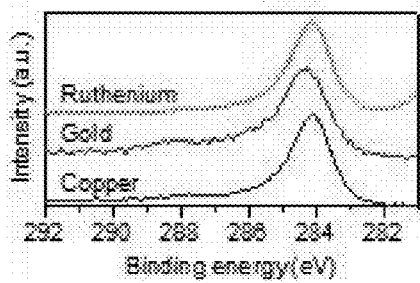
FIG. 16e is a graphical illustration of C1s XPS spectra measured directly on different substrates, according to one embodiment of the present disclosure.
Figure 16F:
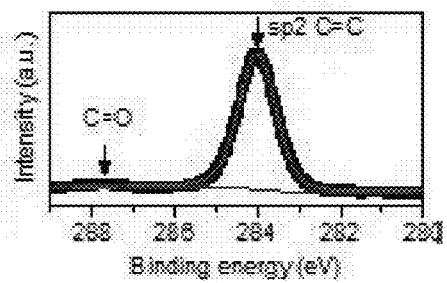
FIG. 16f is a graphical illustration of high resolution C1s XPS spectra on Cu, according to one embodiment of the present disclosure.

In accordance with disclosed embodiments a laser-assisted chemical vapor deposition (CVD) growth process is developed for MAC. The process works on arbitrary substrates. It results in a complete film coverage in under 30 seconds and at substrate temperatures as low as 200° C. Since the laser is the sole heat source, both the process duration and temperature may be adjusted, as needed, such as for further refinement. Such disclosed films can be easily transferred from its growth substrate without sacrificing stability. For simplicity, disclosed embodiments discuss representative data mainly on MAC films grown on a copper foil unless otherwise stated. Unlike polycrystalline 2D crystals, such as graphene (PG) or h-Bn (PG), MAC is freestanding even on liquid surfaces without the need of a support polymer. Without polymer support, PG weakens at its grain boundaries during wet transfer and collapse under the surface tension of water. The release of MAC without a mechanical support reduces transfer-related defects and allows for residue-free transfer. FIGS. 16a and b illustrate the transferred sample on both $SiO_2$/Si wafer and TEM grid, respectively, to be homogenous and continuous. Specifically, FIG. 16a is a graphical illustration of a monolayer of amorphous carbon (MAC) transferred onto a $SiO_2$/Si wafer. FIG. 16b is a graphical illustration of an SEM image of a MAC suspended on a TEM grid with 2.5 μm diameter holes. There is no evidence of multilayer regions or wrinkles that are typically observed with the transfer of 2D layers. The uniform contrast under SEM also suggest uniform electronic conductivity. FIG. 16c illustrates Raman spectra of the amorphous carbon grown on different substrates, with the measurements for Cu and Au done on films transferred to $SiO_2$, while directly measured on Ru. FIG. 16d illustrates Raman spectra for Cu growth showing the D and G bands with fitted curve and an I(D)/I(G) ratio of 0.82. FIG. 16e is a graphical illustration of C1s XPS spectra measured directly on different substrates. FIG. 16f is a graphical illustration of high resolution C1s XPS spectra on Cu with fitted curve showing a single C $sp^2$ peak at 284.0 eV. Samples grown on different metallic substrates were first characterized via Raman spectroscopy and X-ray Photoemission Spectroscopy (XPS) measurements of MAC grown. All samples have nearly identical Raman and XPS spectrums demonstrating that the structure of MAC is indeed substrate independent (FIG. 16c, 16e). Furthermore, the pronounced Raman 2D band at ~2680 $cm^{-1}$ in crystalline carbon is negligible, strongly suggesting the lack of any long-range order[20] (FIG. 16d) (SI). Equally revealing, the is X-ray photoelectron spectroscopy (XPS) spectra in FIG. 16f shows that the bonds in MAC are solely C $sp^2$.

Figure 17B:
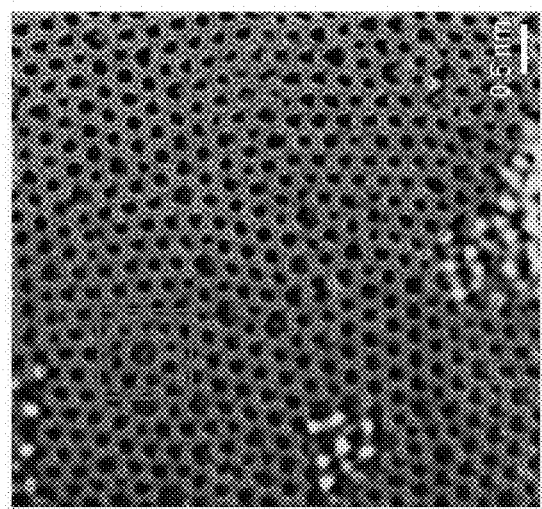
FIG. 17b illustrates a large scale atom-by-atom mapping of the selected region in FIG. 17a, according to one embodiment of the present disclosure.
Figure 17A:
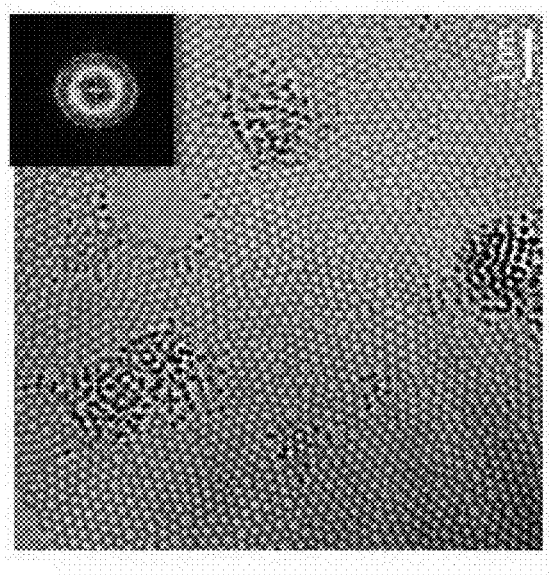
FIG. 17a illustrates a monochromated HRTEM image of the disclosed amorphous carbon monolayer, according to one embodiment of the present disclosure.
Figure 17C:
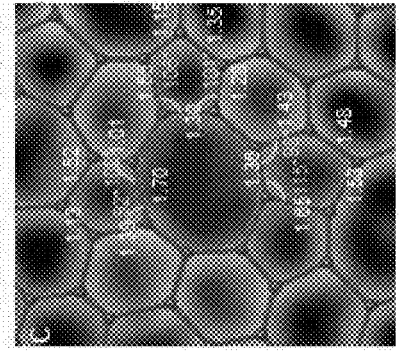
FIG. 17c illustrates a zoom-in region highlighted by the outlined red square in FIG. 17b, according to one embodiment of the present disclosure.
Figures 17D, 17E, 17F:
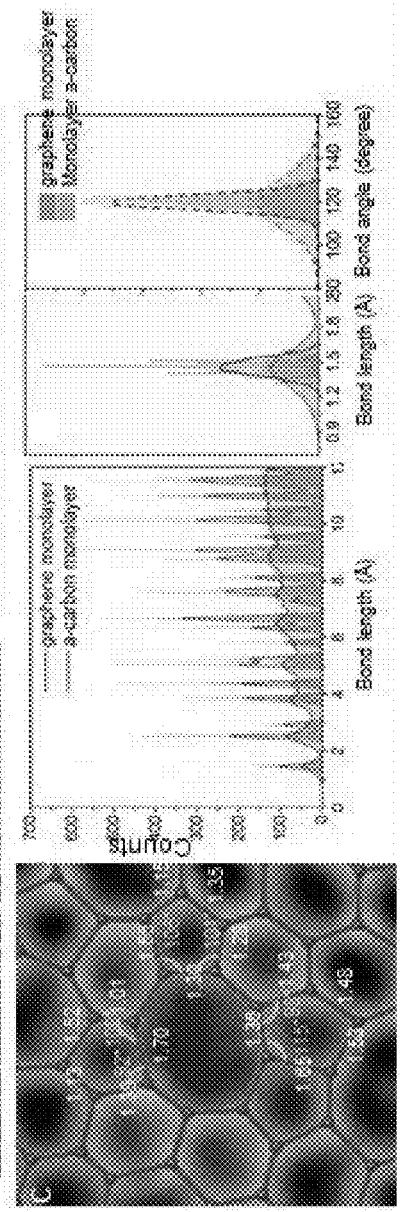
FIG. 17d illustrates a pair correlation function calculated by the mapping coordinate of each carbon atom, according to one embodiment of the present disclosure.
FIG. 17e illustrates the comparison of the bond length distribution for the first neighboring atoms between graphene and the disclosed amorphous carbon monolayer, according to one embodiment of the present disclosure.
FIG. 17f illustrates a statistical histogram of bond angle distribution between MAC and graphene, according to one embodiment of the present disclosure.

To directly determine the exact arrangement of carbon atoms, disclosed embodiments utilized aberration corrected high-resolution transmission electron microscopy (HR-TEM). FIG. 17 is directed to the morphology of the disclosed monolayer amorphous carbon. FIG. 17a is a monochromated HRTEM image of the disclosed amorphous carbon monolayer. The sample is imaged at 700° C. in order to eliminate any carbon redeposition. Due to the reduced chromatic aberration, each carbon atom can be clearly seen in the image. FIG. 17b illustrates a large scale atom-by-atom mapping of the selected region in FIG. 17a. Pentagons, octagons and strained hexagons are omnipresent. The contrast of the image is inverted and false colored for better visibility. FIG. 17c illustrates a zoom-in region highlighted by the outlined red square in FIG. 17b. The pentagons, octagons and strained hexagons are colored as red, blue and green, respectively. The bond length and bond angle of each pentagon is precisely measured, indicating a wide variety of distribution in both the bond length and angle, a disorder feature in monolayer. FIG. 17d illustrates a pair correlation function calculated by the mapping coordinate of each carbon atom. Graphene imaged under similar condition and the same mapping algorithm is shown as a reference. FIG. 17e illustates the comparison of the bond length distribution for the first neighboring atoms between graphene and the disclosed amorphous carbon monolayer. The peak is not a sharp delta function in graphene due to the image aberration and algorithmic error, but is still centered at 1.4 A with a small variation. In contrast, the disclosed amorphous carbon layer has a much broader variation from 0.9-1.8 A. FIG. 17f illustrates a statistical histogram of bond angle distribution between MAC and graphene.

The disclosed HRTEM image reveals the presence of connected hexagonal and non-hexagonal structures in a form of 5-, 7-, and 8-membered rings (FIGS. 17a-c). Crucially, the observed lattice disorders are randomly distributed; a stark contrast exists to point to defects in defected graphene, or grain boundaries at the interface between crystals.[21] While the lattice structure of stable crystals are easily determined by TEM, direct imaging of amorphous structure was not possible, as 2D amorphous did not exist until recently. Not much was known about the composition of the amorphous network, and a quantitative measure of amorphousity should be adopted as a standard reference. Lichtenstein, et al. recently defined crystallinity (or "amorphousity") of a sample as the ratio of the total number of hexagons, $N_6$, over the total polygons[22];

$$C = \frac{N_6}{\sum_{s=4}^{9} N_s} \quad (1)$$

For a perfect crystal, C is equal to 1. On the other hand, simulations by Jain and Barkema of an unbiased isotropic three-fold connected random network suggest the theoretical amorphous limit of C~0.60[23]. The disclosed MAC closely resembles such a network with C values ranging from 0.60 to 0.65 with an average value of C=0.64±0.03 over an average area of 8 $nm^2$ (See FIGS. 17a-c for color coded ring size analysis and ring size distribution). Hence, the disclosed embodiment clearly approaches the theoretical limit. Disclosed embodiments also evaluated the pair correlation function of neighboring carbon atoms and observe that they disappear quickly beyond the second nearest neighbor (FIG. 17d-f). This directly confirms the loss of long-range periodic order. Furthermore, carbon sp2 bonds in MAC are as severely distorted, exhibiting a broad bond length variation from 0.9-1.8 Å and large deviation in bond angles in both in plane and out-of-plane. It is surprising, since theoretical breaking strain at 25-30% on a graphene crystal occurs with deformation at just under 1.6 Å and 135°[24], much smaller than what was obtained. Furthermore, the suspended MAC was annealed at 700° C. and exposed to 60 keV electron irradiation without visible damage, especially since disclosed embodiments do not observe TEM induced Stone-Wales defects or vacancies.

Disclosed embodiments investigated the mechanical properties of such suspended MAC membranes in more detail by indentation experiments using atomic force microscopy (AFM) with diamond tips. MAC breaks when indentation force is approximately 200 nN, similar to PG, and approximately one order of magnitude lower fracture load than single crystalline graphene (SG) or h-bN[25].

Figures 18A, 18B, 18C, 18D, 18E, 18F:
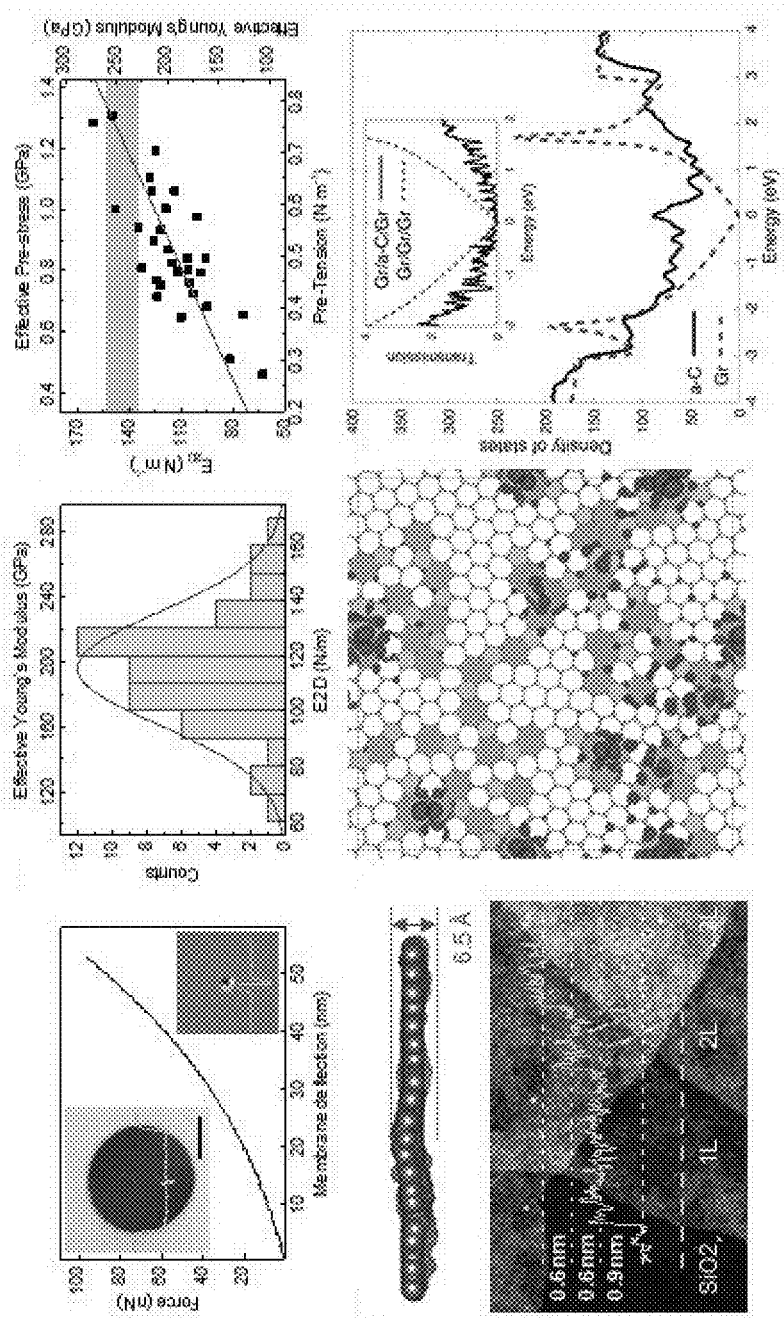
FIG. 18a illustrates a force vs. deflection curve, according to one embodiment of the present disclosure.
FIG. 18b illustrates a histogram of the 2D elastic stiffness of exemplary membranes, according to one embodiment of the present disclosure.
FIG. 18c shows graph illustrating a 2D elastic modulus vs. pre-tension with linear fit (red line) and theoretical range, according to one embodiment of the present disclosure.
FIG. 18d illustrates a theoretical simulation and AFM images of layers of MAC on $SiO_2$/Si, according to one embodiment of the present disclosure.
FIG. 18e illustrates a theoretical model used for simulations, according to one embodiment of the present disclosure.
FIG. 18f illustrates a density of states (DOS) simulation, according to one embodiment of the present disclosure.

FIG. 18a illustrates a force vs. deflection curve and curve fitting to Equation (2) for the calculation of $E_{2D}$ and pre-tension values. The left inset is an AFM scan of MAC suspended on a 2.5 µm diameter well. The cyan line is the height profile along the center with 10.0 nm adhesion depth to well wall. Scale bar, 1um. The right inset illustrates an indentation fracture at the center of MAC. The cyan line is the height profile along the center. Image width, 500 nm. It is immediately clear that the indentation rupture is restricted and does not propagate (FIG. 18a). This is in stark contrast to any other crystalline 2D material such as PG or h-BN, which always collapses by cracks propagation at the grain boundary (see also SI). This means that PG is brittle and fails upon fracture, without even getting close to its high intrinsic strength, while the disclosed MAC preserve its strength even with fracture. This implies that the fracture toughness of the disclosed MAC is significantly higher than that of most 2D crystals including even for PG[26].

FIG. 18b illustrates a histogram of the 2D elastic stiffness of an exemplary 39 membranes studied. There is a correlation between pre-tension and 2D elastic stiffness ($E_{2D}$), leading to a wide range of $E_{2D}$=63-161 Nm$^{-1}$. FIG. 18c shows graph illustrating a 2D elastic modulus vs. pre-tension with linear fit (red line) and theoretical range (blue band). The resulting non-linear but fully reversible $E_{2D}$ increases in stiffness with increasing pre-tension (FIG. 18c), which is typical of a polymer network rather than a continuous sheet. The disclosed MAC changes from a soft to hard material with stretching, and points towards unstretched MAC being much more flexible than graphene.

Next, disclosed embodiments identify the thickness of MAC via AFM. Here, multiple wet transfers were used to achieve overlapping layers of MAC on SiO$_2$/Si, and to rule out artifacts from the substrate interaction. Turning to FIG. 18d, the top illustration shows a theoretical simulation of out-of-plane structural relaxation increases monolayer thickness from in-plane thickness of 3.4 Å. The bottom portion of FIG. 18d illustrates AFM images of 1-3 layers of MAC on SiO$_2$/Si. The cyan dash line indicates line scan position for overlaid height profile. The inset: Image width, 3 µm. From these measurements, a step height of 0.6 nm was measured (FIG. 18d). The step height of a single MAC layer was measured on atomically flat hexagonal Boron Nitride (h-BN) surface to be 0.58 nm step height. According to disclosed embodiments, the step heights of MAC grown on other surfaces are similar. For example, MAC grown on gold is approximately 0.6 nm thick (details in SI).

To better understand the origin of all of the improved and non-expected properties, the disclosed embodiment turns to theoretical modeling by means of DFT. Below, key results are summarized and refer for details on modeling to SI. First, a large interatomic distance is observed of 0.65 nm between MAC layers caused by short-range wrinkles from the amorphous structure, in good agreement with AFM step height measurement. This is almost twice as high as graphene and similar to Phosphorene (bP) where the (periodic) ridged layer structure results in a film thickness of 0.6 nm.

A more careful analysis of TEM images suggest the extreme bond parameters of the TEM in-plane projections are actually established by large out-of-plane distortions (wrinkles). This explains the unexpected stability of highly strained bonds in accordance with disclosed embodiments. In fact, such large uniaxial strain in hexagonal sp2 carbon is expected to create a band gap locally[27]. Disclosed embodiments obtained a range of $E_{2D}$=135-153 Nm$^{-1}$ from a theoretical model, in agreement with the disclosed experimental results. Furthermore, the disclosed flexibility of MAC is significantly enhanced by increasing the fraction of 8-carbon rings within the structure.

FIG. 18e illustrates a theoretical model used for simulations in accordance with disclosed embodiments. Given the disclosed reliable model for the stable amorphous structure seen in the TEM, a density of states (DOS) simulation is performed to predict its electronic properties. From this, it is seen that charges are localized in very small regions (radius, r=0.4±0.2 nm), which are well separated (Δr=1±0.5 nm) (FIG. 18e). Everywhere else the DOS vanishes similar to a gapped material. This should severely suppress hopping conductance. If the system of localized sites (1=0.75) is considered to be analogous to a graphene quantum dot array[28], optically, the disclosed system should behave as if it is has a 2 eV optical gap. In terms of transport gap, MAC should behave like a conventional insulator at elevated temperature. However, the temperature dependence of the resistivity should still show a fundamental difference in conduction mechanism to that of a gapped crystalline material. Since the separation between localized sites is very large, disclosed embodiments expect to observe variable range hopping at low temperatures.

Figure 19C:
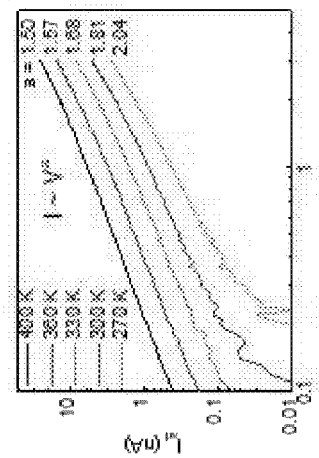
FIG. 19c illustrates nonlinear curves measured at five different temperatures, according to one embodiment of the present disclosure.

For a better understanding, disclosed embodiments measure the charge transport in the material. FIG. 19a provides a SEM image of the two-terminal device with 200 nm-1 µm channel width between a 50 µm long electrodes. The inset is a close up of MAC/SiO$_2$ edge in a 1 µm channel. The ease of transfer to and stability on insulating substrates allows disclosed embodiments to carefully study both its optical properties and transport properties (FIG. 19a). Optical measurements are first examined according to disclosed embodiments.

Figure 19B:
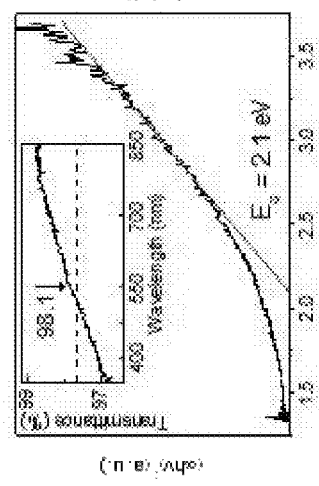
FIG. 19b illustrates optical transmittance of 2D amorphous carbon, according to one embodiment of the present disclosure.
Figure 19A:
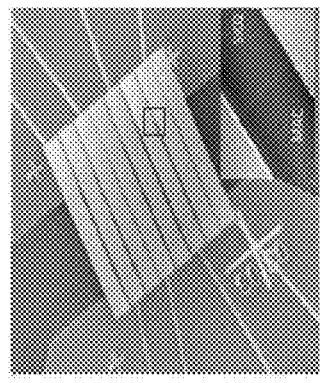
FIG. 19a illustrates a SEM image of the two-terminal device, according to one embodiment of the present disclosure.

FIG. 19b illustrates optical transmittance of 2D amorphous carbon measured by transferring the film on a quartz substrate. The dashed line indicates pristine graphene absorption at 2.3%. The inset represents a Tauc plot to determine the optical bandgap in amorphous materials, with extrapolation of the linear region (red line) estimating an optical band gap of 2.1 eV. At TRT, the optical transmittance of MAC was measured to be 98.1% at 550 nm wavelength, higher than the intrinsic 97.7% transmittance of graphene (FIG. 19b). More importantly, the Tauc plot gives an optical band gap of 2.1 eV, well within the range of the predicted values. The plot has a long tail towards lower energies, which confirm a wide energy distribution of localized states. Disclosed embodiments also observe a Photoluminescence (PL) signal from MAC with a pronounced PL peak at 2.04 eV. Both are in agreement with localization effect.

A discussion of transport measurements is provided according to disclosed embodiments. Details of the device fabrication and the data analysis are discussed in SI. The main results are summarized accordingly. Source drain bias dependent measurements as a function of temperature were performed on 1, 2, and 3 layer devices with large width to length ratios (50 µm:0.2 µm<w:1<50 µm:1 µm). Already at room temperature the devices exhibit insulating behavior with sheet resistance values in the order of 100 GΩ. In 2D, these values are the most resistive measured, 2 orders of magnitude higher than what has been previously reported to h-BN with trap sites of ~10$^{10}$ cm$^{-2}$, even the tunneling resistance values measured were equally high, with 1-layer (2-layer) MAC performing similar to 2-layer (4-layer) h-BN. In addition, I-V characteristics have voltage dependence to space-charge-limited current, I=V^α, where a equals to $2^{30}$ (FIG. 19c). This identifies the system as a simple insulator (like h-BN) with low trap density random energy distribution, in good agreement the disclosed invention.

Figure 19F:
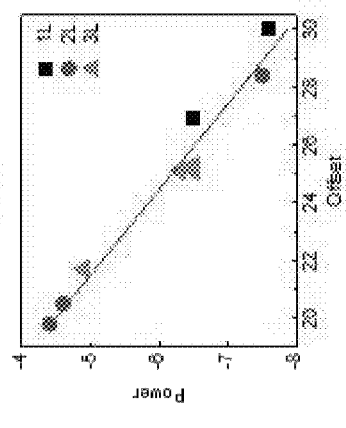
FIG. 19f illustrates a linear fit of resistivity of offset vs. the power, according to one embodiment of the present disclosure.
Figure 19E:
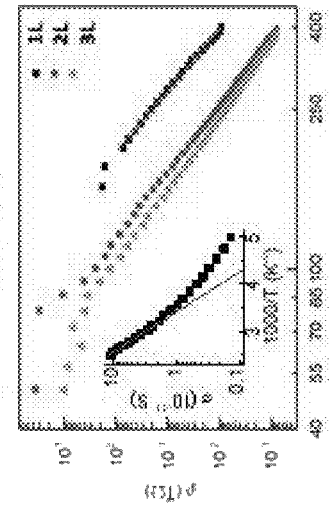
FIG. 19e illustrates resistivity for samples with different layer numbers as a function of temperature, according to one embodiment of the present disclosure.
Figure 19D:
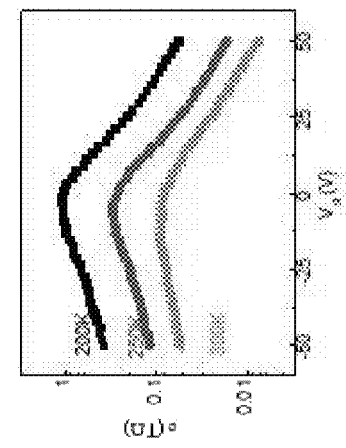
FIG. 19d illustrates resistivity as a function of gate voltage for different temperatures measured, according to one embodiment of the present disclosure.

Energy required for hopping between trap sites manifests itself in the activation energy of transport. In FIG. 19e, resistivity for the samples with different layer numbers is measured as a function of temperature. The red line is the linear best fit with the offset and slope equal to 26.9±0.05 and −6.5±0.05, respectively. The inset is a replot as Arrhenius plot to obtain the activation energy of 470 meV. In accordance with disclosed embodiments, a large activation energy was measured of 235 meV from the Arrhenius plot (FIG. 19e), larger than the 193 meV activation energy seen in the N2 vacancy traps in h-BN[31]. Only at lower temperature is there an indication that this type of transport is different from conventional hopping transport. The model expects variable range hopping between localized sites to follow the exponential dependence of Mott law $\rho \propto e^{T^\gamma}$, where $\rho=1/3$, but, according to the disclosed embodiment, power law dependence (FIG. 19e) is observed. Such transport mechanism happens in an insulating 1D chain, by tunnel hopping between localized sites of similar range along its linear path[32]. This rare-chain hopping (RCH) is given by, $\rho=10^\beta T^N$, where N is the number of localised sites within the chain. FIG. 19f illustrates a linear fit of resistivity of offset, α, vs. the power, γ as described by the formula $\rho=10^\beta T^N$. Although β and N vary from between samples, disclosed embodiments that observe a linear correlation is shown in FIG. 19f, with N=2.2(±0.6)−0.33(±0.02)β (FIG. 19f). This means that every additional tunneling between localized site increase the resistivity by 3 orders of magnitude, explaining the highly insulating behavior of our material.

According to the disclosed invention, a method is shown for large area growth of freestanding monolayer of sp2 amorphous carbon film. This is the first example of an amorphous material in the 2D limit. It can be grown directly on a wide range of surfaces at low temperatures making it a more enticing than crystalline 2D materials for many device applications. Examples may range from anti-oxidation coating on magnetic hard disc for heat assisted magnetic recording to coatings on current collector electrodes in batteries. On the other hand, direct growth on e.g., glass well plates would make it very practical for biomedical research, e.g., stem cell research. The insulting behavior also make it an attractive 2D dielectric for FET, spin dependent tunneling barrier in magnetic tunneling junctions and even for use in electronic synapses. Its higher mechanical stability under strain make it also promising for nanopore type of applications. Last but not least, the insulating behavior in conjunction with the high the large carbon rings make it an even more promising 2D material for proton membrane applications than graphene itself. Generally speaking, many applications for 2D materials require direct growth on specific target substrates or on top of devices, better mechanical flexibility and insulating behavior. The disclosed MAC provides an appealing alternative for these applications.

The system, as described in the present technique or any of its components, may be embodied in the form of data storage media, for example, for a computer system. Typical examples of a computer system includes a general-purpose computer, a programmed microprocessor, a micro-controller, a peripheral integrated circuit element, and other devices or arrangements of devices that are capable of implementing the steps that constitute the method of the present technique.

The computer system comprises a computer, an input device, a display unit and/or the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. The storage device can also be other similar means for loading computer programs or other instructions into the computer system. The computer system also includes a communication unit. The communication unit allows the computer to connect to other databases and the Internet through an I/O interface. The communication unit allows the transfer as well as reception of data from other databases. The communication unit may include a modem, an Ethernet card, or any similar device which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present technique. The set of instructions may be in the form of a software program. Further, the software may be in the form of a collection of separate programs, a program module with a larger program or a portion of a program module, as in the present technique. The software may also include modular programming in the form of object-oriented programming. The processing of input data by the processing machine may be in response to user commands, results of previous processing or a request made by another processing machine.

Having described the many embodiments of the present disclosure in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

REFERENCES

The following references are referred to above and are incorporated herein by reference:
1. Dwivedi, Neeraj, et al. "Understanding the role of nitrogen in plasma-assisted surface modification of magnetic recording media with and without ultrathin carbon overcoats." *Scientific reports* 5 (2015): 7772.
2. Yuan, Hua, et al. "Underlayers for heat assisted magnetic recording (HAMR) media." U.S. Pat. No. 8,941,950. 27 Jan. 2015.

3. Schmittinger, W. & Vahidi, A. "A review of the main parameters influencing long-term performance and durability of PEM fuel cells." *Journal of Power Sources* 180, 1-14 (2008).
4. Ferrari, A. C. et al. "Interpretation of Raman spectra of disordered and amorphous carbon." *Physical Review B* 61, 14095-14107 (2000).
5. Robertson, J. "Ultrathin carbon coatings for magnetic storage technology." *Thin Solid Films* 383, 81-88 (2001).
6. Hu, S. et al. "Proton transport through one-atom-thick crystals." *Nature* 516, 227-230 (2014).
7. Das, S. et al. "Measurements of adhesion energy of graphene to metallic substrates." *Carbon* 59, 121-129 (2013).
8. Choi, W. J. et al. "Effects of substrate conductivity on cell morphogenesis and proliferation using tailored, atomic layer deposition-grown ZnO thin films." *Scientific Reports* 5, 9974 (2015).
9. Schriver, M. et al. "Graphene as a Long-Term Metal Oxidation Barrier: Worse Than Nothing" *ACS Nano* 7, 5763-5768 (2013).
10. Wang, J. S. et al. "The mechanical performance of DLC films on steel substrates." *Thin Solid Films* 325, 163-174 (1998).
11. Marcon, et. al. "The head-disk interface roadmap to an areal density of 4 Tbit/in$^2$." *Advances in Tribology* 2013, 1-8 (2013).
12. Zhang, Lihong, and Samuel Gan. "Protective overcoat layer of carbon and a selected transition metal." U.S. Pat. No. 8,760,980. 24 Jun. 2014.
13. Rose, Franck, et al. "Complete characterization by Raman spectroscopy of the structural properties of thin hydrogenated diamond-like carbon films exposed to rapid thermal annealing." *Journal of Applied Physics* 116.12 (2014): 123516.
14. Jones, Paul M., et al. "Understanding disk carbon loss kinetics for heat assisted magnetic recording." *IEEE Transactions on Magnetics* 50.3 (2014): 144-147.
15. Chengjun, S. U. N., and B. Ramamurthy Acharya. "Perpendicular magnetic recording medium with an ordering temperature reducing layer." U.S. Pat. No. 8,173,282. 8 May 2012.
16. Rejda, Edwin Frank, et al. "Magnetic devices with variable overcoats." U.S. patent application Ser. No. 13/790,022.
17. Chem. Rev., 1989, 89 (6), p. 1323.
18. Nano Lett., 2012, 12 (2), p. 1081.
19. Adv. Mater. 2017, 29, 1700639.
20. Nature Comm 5, 3186 (2014).
21, Nano Lett. 10, 4, 1144.
22. Lichtenstein, PRL 109.
23. Phys. Chem. Chem. Phys., 2018, 20, 16966.
24. Scientific Reports volume 7, 41398 (2017).
25. Nano Lett. 11, 6, 2259.
26. Nature Comm 5, 3782 (2014).
27. Phys. Rev. B 78, 075435.
28. Nat. Mat. 8, p. 235 (2009).
29. Nano Lett., 2015, 15 (4) pp 2263.
30. PhysRev.97.1538.
31. *ACS Appl. Mater. Interfaces,* 2018, 10 (20), pp 17287.
32. PhysRevB.84.125447.

All documents, patents, journal articles and other materials cited in the present application are incorporated herein by reference.

While the present disclosure has been disclosed with references to certain embodiments, numerous modification, alterations, and changes to the described embodiments are possible without departing from the sphere and scope of the present disclosure, as defined in the appended claims. Accordingly, it is intended that the present disclosure not be limited to the described embodiments, but that it has the full scope defined by the language of the following claims, and equivalents thereof.

What is claimed is:

1. A recording device comprising:
   an overcoat layer on a substrate,
   wherein the overcoat layer comprises an amorphous carbon layer having a crystallinity (C) ≤0.8,
   wherein the crystallinity (C)=number of hexagons:(number of hexagons+number of non-hexagons).
2. The device of claim 1, wherein the overcoat layer comprises a two-dimensional (2D) amorphous carbon film.
3. The device of claim 2, wherein the 2D amorphous carbon film has a resistivity of 0.01 to 1000 Ω-cm, inclusive.
4. The device of claim 2, wherein the 2D amorphous carbon film has a crystallinity (C)≤0.8 and a sp$^3$/sp$^2$ bond ratio is 0.2 or less.
5. The device of claim 2, wherein the 2D amorphous carbon film has a transparency equal to or greater than 98% at a wavelength of 550 nm or higher.
6. The device of claim 2, wherein a water contact angle of the overcoat layer is 60.
7. The device of claim 2, wherein the 2D amorphous carbon film contains an Sp2 carbon bond of more than 99%.
8. The device of claim 2, wherein the 2D amorphous carbon film undergoes substantially no bond change up to 700° C.
9. The device of claim 2, wherein a range of coefficient of friction (COF) of the 2D amorphous carbon film is approximately 0.2-0.4.
10. The device of claim 2, wherein the 2D amorphous carbon film has a reflection less than 5% in an ultraviolet (UV) region.
11. The device of claim 1, wherein the recording device comprises a magnetic recording media.
12. The device of claim 1, wherein the recording device is a heat assisted magnetic recording media.
13. The device of claim 1, comprising:
   an underlying magnetic recording layer,
   wherein the overcoat layer protects the underlying magnetic recording layer.
14. The device of claim 1, comprising additional layers.
15. The device of claim 14, wherein the additional layers are selected from the group consisting of:
   a substrate layer;
   an adhesion layer;
   a heat sink layer;
   a soft under layer;
   another under layer;
   a recording layer;
   a capping layer; a lubricant layer; and combinations thereof.
16. The device of claim 15, wherein the substrate layer is selected from the group consisting of: metallic substrates, glass, and an oxide of a material.
17. A magnetic recording media device comprising:
   a substrate layer;
   an adhesion layer;
   a heat sink layer;
   a soft under layer;
   another under layer;
   a recording layer;
   a capping layer;
   an overcoat layer; and
   a lubricant layer,
   wherein the overcoat layer comprises an amorphous carbon overcoat layer having a crystallinity (C)≤0.8, and
   wherein the crystallinity (C)=number of hexagons:(number of hexagons+number of non-hexagons).

18. The device of claim 17, wherein the overcoat layer comprises a two-dimensional (2D) amorphous carbon film.

19. The device of claim 18, wherein the 2D amorphous carbon film contains an Sp2 carbon bond of more than 99%.

20. The device of claim 18, wherein the 2D amorphous carbon film undergoes substantially no bond change up to 700° C.

21. The device of claim 18, wherein a range of coefficient of friction (COF) of the 2D amorphous carbon film is approximately 0.2-0.4.

22. The device of claim 18, wherein the 2D amorphous carbon film has a reflection less than 5% in an ultraviolet (UV) region.

* * * * *